United States Patent [19]
Mori et al.

[11] Patent Number: 5,499,214
[45] Date of Patent: Mar. 12, 1996

[54] OSCILLATOR CIRCUIT GENERATING A CLOCK SIGNAL HAVING A TEMPERATURE DEPENDENT CYCLE AND A SEMICONDUCTOR MEMORY DEVICE INCLUDING THE SAME

[75] Inventors: Shigeru Mori; Takeshi Kajimoto; Masanori Hayashikoshi, all of Hyogo, Japan

[73] Assignee: Mitsubishi Denki Kabushiki Kaisha, Tokyo, Japan

[21] Appl. No.: 257,845

[22] Filed: Jun. 10, 1994

[30] Foreign Application Priority Data

Jun. 28, 1993 [JP] Japan .................................. 5-157237
Feb. 16, 1994 [JP] Japan .................................. 6-019210

[51] Int. Cl.$^6$ .................................................. G11C 7/00
[52] U.S. Cl. .......................... 365/222; 365/211; 365/225.7
[58] Field of Search ........................... 365/211, 222, 365/225.7; 327/83, 88, 262, 291, 108

[56] References Cited

U.S. PATENT DOCUMENTS 5,311,476  5/1994  Kajimoto et al. ................... 365/222
5,375,093  12/1994  Hirano ................................ 365/222

FOREIGN PATENT DOCUMENTS 0128427   12/1984  European Pat. Off. .
4314321   8/1992   Germany .
61-139995 6/1986   Japan .
63-100698 5/1988   Japan .
63-276316 11/1988  Japan .
4-192178  7/1992   Japan .
4-344387  11/1992  Japan .
2261755   11/1991  United Kingdom .

OTHER PUBLICATIONS

1993 Symposium on VLSI Circuits Digest of Technical Papers, May 19–21, 1993/Kyoto, Sponsored by The Japan Society of Applied Physics and The IEEE Solid–State Circuits Council, pp. viii, 43–44.

*Primary Examiner*—David C. Nelms
*Assistant Examiner*—Vu A. Le
*Attorney, Agent, or Firm*—Lowe, Price, LeBlanc & Becker

[57] ABSTRACT

In a semiconductor memory device, a constant voltage is applied to a resistor having a positive temperature coefficient, whereby a first reference current flowing through that resistor is converted into a voltage by a resistor. That voltage is converted into a second reference current by a P channel MOS transistor, whereby a second current of a value equal to the value of the second reference current flows through each of a plurality of inverters by a current mirror circuit. These inverters are connected in a ring manner to form a ring oscillator. The first reference current becomes lower as the operating temperature rises, whereby the second reference current increases. As a result, the oscillator cycle of the ring oscillator becomes shorter as the operating temperature rises.

13 Claims, 23 Drawing Sheets

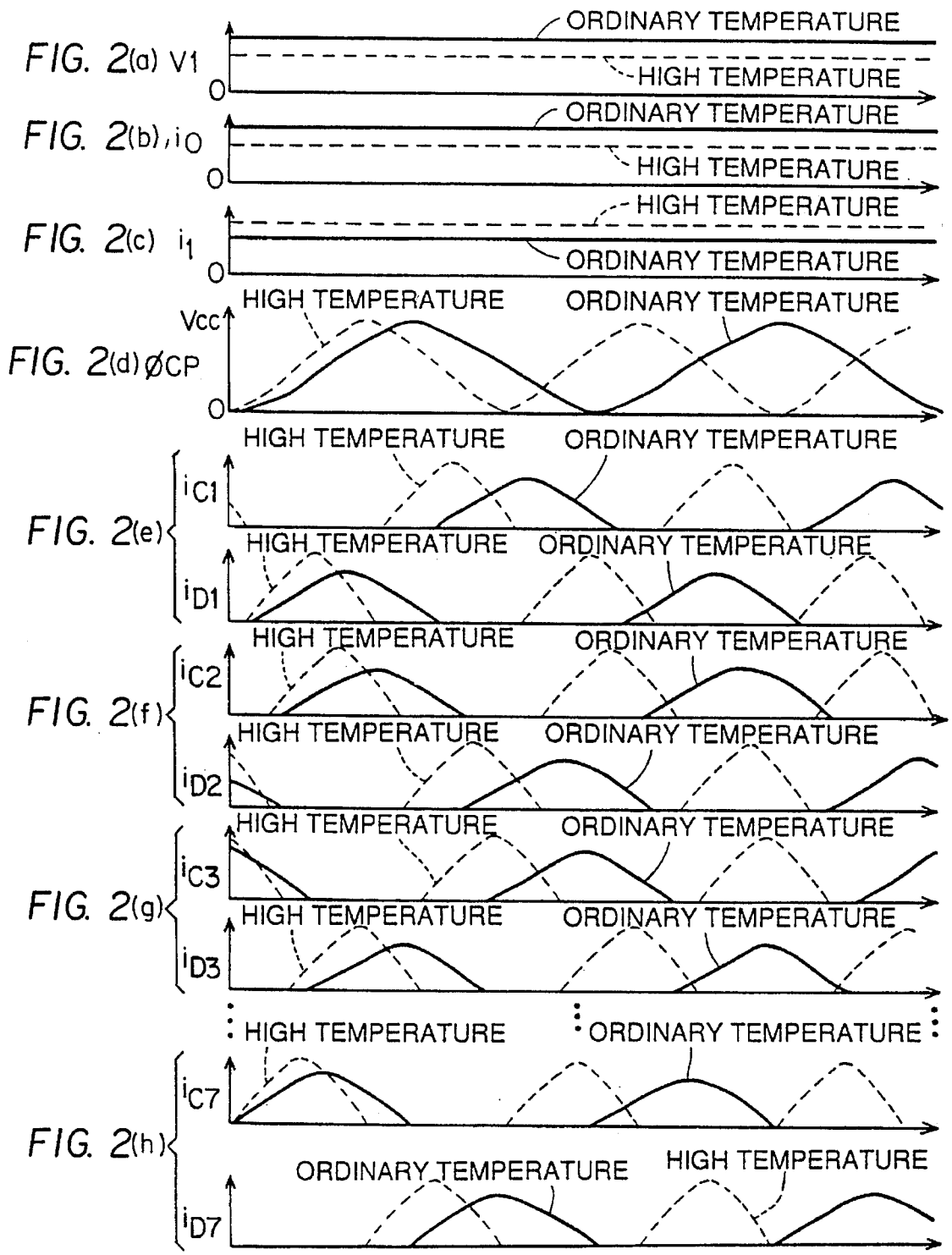

FIG. 3A
FIG. 3B
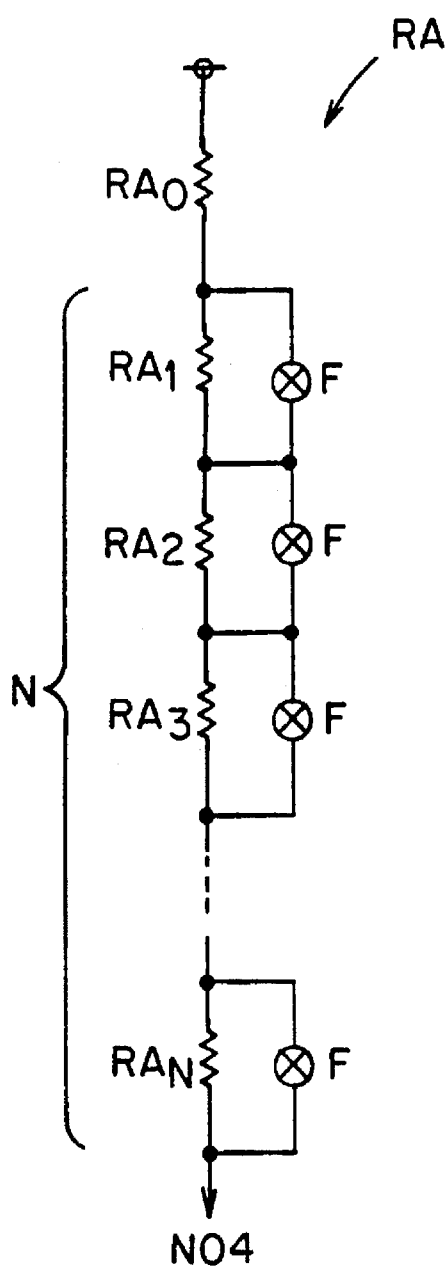
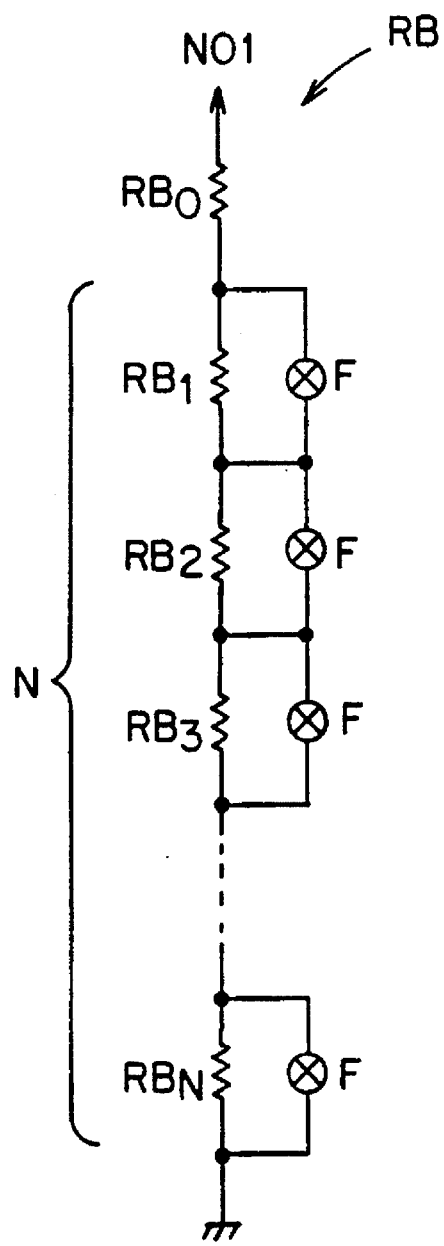

OSCILLATOR CIRCUIT GENERATING A CLOCK SIGNAL HAVING A TEMPERATURE DEPENDENT CYCLE AND A SEMICONDUCTOR MEMORY DEVICE INCLUDING THE SAME

BACKGROUND OF THE INVENTION

1. Field of the Invention

The present invention relates to an oscillator circuit and a semiconductor memory device using the same, and to improvement of an oscillator circuit generating a clock signal for controlling, for example, a refresh operation.

2. Description of the Background Art

In the field of oscillator circuits generating a clock signal, particularly an oscillator circuit incorporated in a semiconductor integrated circuit, the demand for an oscillator circuit having the frequency of a clock signal altered according to a change in operating temperature is increasing. This demand is particularly appreciable for an oscillator circuit that generates a clock signal for controlling a refresh operation in, for example, a DRAM.

Because the data retaining time period in a memory cell of a DRAM becomes shorter due to increase in leakage current caused by a rise in operating temperature, a refresh operation must be carried out frequently, in other words, the refresh cycle must be shortened. However, a shorter refresh cycle will result in a greater number of refresh operations even at a low operating temperature, i.e. at ordinary temperature, to increase current consumption. This becomes a critical problem when a DRAM operative by a power supply of 5 V is operated by a low power supply of 3.3 V.

Therefore, an oscillator circuit generating a clock signal for controlling a refresh operation is desired having the oscillation frequency altered according to a change in temperature, so that the refresh cycle is lengthened when operating at ordinary temperature to decrease current consumption and the refresh cycle is shortened when operating at a high temperature to carry out a refresh operation reliably.

The foregoing will be described in detail with an oscillator circuit applied in a DRAM.

FIG. 22 is a block diagram showing an entire structure of a DRAM (Dynamic Random Access Memory).

Referring to FIG. 22, a DRAM includes a memory cell array 1, a RAS buffer 2, a CAS buffer 3, a WE buffer 4, a row address buffer 5, a row decoder 6, a word driver 7, a sense amplifier 8, a column address buffer 9, a column decoder 10, and an I/O circuit 11.

Memory cell array 1 includes a plurality of word lines, and a plurality of bit line pairs crossing the plurality of word lines, and a plurality of memory cells disposed in the proximity of the crossings thereof. Each memory cell includes a capacitor for storing data, and an N channel transistor. An N channel transistor is connected between the capacitor and a bit line. The N channel transistor has its gate connected to a word line.

RAS buffer 2 receives an external row address strobe signal/RAS to generate an internal row address strobe signal/RAS1. CAS buffer 3 receives an external column address strobe signal/CAS to generate an internal column address strobe signal/CAS1. WE buffer 4 receives an external write enable signal/W to generate an internal write enable signal/WI.

In a general operation mode, row address buffer 5 receives an external row address signal ADD via a switch 17 and generates a row address signal in response to an internal row address strobe signal/RAS1. Row decoder 6 responds to a row address signal from row address buffer 5 to select one of the plurality of word lines in memory cell array 1. Word driver 7 drives the word line selected by row decoder 6 to a predetermined voltage. As a result, data from each of the plurality of memory cells connected to the selected word line is read out to a corresponding bit line. Data read out on each bit line is amplified by a sense amplifier 8.

Column address buffer 9 receives an external column address signal ADD to generate a column address signal in response to an internal column address strobe signal/CAS1. Column decoder 10 responds to a column address signal to select one of the plurality of bit line pairs. As a result, the selected bit line pair is connected to an input/output line pair 12.

In a writing operation, an externally applied input data D is provided to an input/output line pair 12 via I/O circuit 11. In a reading operation, data on an input/output line pair 12 is output as data D via I/O circuit 11.

A DRAM has data stored by providing charge to a capacitor. It is therefore necessary to rewrite data within a constant time period to retain the stored data.

Therefore, this DRAM further includes a self refresh switching circuit 13, an internal address generation circuit 14, a ring oscillator 15, and a frequency divider 16.

Self refresh switching circuit 13 responds to internal row address strobe signal/RAS1 and internal column address strobe signal/CAS1 to generate a self refresh signal SREF indicating that a refresh operation is carried out internally and automatically. Internal address generation circuit 14 is activated in response to self refresh signal SREF, and sequentially generates a refresh address signal indicating a refresh address in response to internal row address strobe signal/RAS1.

Referring to FIG. 23, ring oscillator 15 includes inverters I1–I7 of an odd number of stages connected in a ring manner for generating a clock signal $\phi_{CP}$ of a constant cycle. Frequency divider 16 includes a plurality of counters C1–Cn to divide a frequency of clock signal $\phi_{CP}$ for generating a refresh enable signal REFE. RAS buffer 2 further responds to a refresh enable signal REFE to generate internal row address strobe signal/RAS1.

A self refresh operation of this DRAM will be described hereinafter with reference to the timing chart of FIG. 24.

When external row address strobe signal/RAS is brought to a L level (logical low) at time t1 after the fall of external column address strobe signal/CAS to a L level (/CAS before/RAS refresh cycle), self refresh switching circuit 13 pulls self refresh signal SREF to a H level (logical high) at time t2, i.e. at an elapse of a predetermined time period from time t1. This causes internal address generation circuit 14 and ring oscillator 15 to be activated. As a result, ring oscillator 15 generates a clock signal $\phi_{CP}$. Frequency divider 16 frequency-divides clock signal $\phi_{CP}$ for generating a refresh enable signal REFE. RAS buffer 2 responds to refresh enable signal REFE for rendering internal row address strobe signal/RAS1 to a H level and a L level alternately. Internal address generation circuit 14 responds to internal row address strobe signal/RAS1 for sequentially generating a refresh address signal.

Row address buffer 5 responds to the fall of external row address strobe signal/RAS1 for sequentially providing to row decoder 6 a refresh address signal from internal address generation circuit 14. Row decoder 6 responds to a refresh address signal to sequentially select a word line in memory cell array 1. Word driver 7 drives the word line selected by row decoder 6 to a predetermined voltage. This causes data to be read out from each of the plurality of memory cells connected to the selected word line into a corresponding bit line. The data read out from each bit line is amplified by sense amplifier 8. This amplified data is written again into the read out memory cell via a bit line. Thus, data in a plurality of memory cells connected to a selected word line are refreshed.

Execution of such a self refresh operation of reading out data from a memory cell and then writing data into the memory cell again expends current. Therefore, current consumption increases as the number of refresh operations per unit time is increased.

In order to minimize current consumption, the cycle of an internal row address strobe signal/RAS1 generated according to ring oscillator 15 and frequency divider 16 is made as long as possible insofar as the data retention of a memory cell is not degraded. Because it is generally difficult to continuously alter the frequency dividing rate of frequency divider 16, the oscillation cycle of ring oscillator 15 is set as long as possible.

If the data retaining performance is superior, the cycle of internal row address strobe signal/RAS1 can be lengthened extremely. If the data retaining performance is poor, the cycle must be shortened. In this case, the number of refresh operations executed within a predetermined time is increased to increase operating current.

Data retainability is determined according to various factors such as the structure of a memory cell, conditions in the manufacturing process, the capacity of the capacitor, and the sensitivity of the sense amplifier. Therefore, appropriate adjustment is carried out for each DRAM to optimize the cycle of an internal row address strobe signal/RAS.

In the above-described DRAM, RAS buffer 2, row address buffer 5, row decoder 6, word driver 7, sense amplifier 8, sense refresh switching circuit 13, internal address generation circuit 14, frequency divider 16, and ring oscillator 15 form refresh means for carrying out a refresh operation of a memory cell.

In the above-described conventional DRAM, the cycle of internal row address strobe signal/RAS1 is determined by ring oscillator 15. Therefore, when the operating temperature becomes high to result in a greater resistance of transistors forming inverters I1–I7, the oscillation cycle is lengthened. There was a problem that the time period from the fall to the next fall of a refresh enable signal REFE (referred to as a "self refresh cycle" hereinafter) when self refresh signal SREF attains a H level becomes longer as the operating temperature rises.

The data retaining time period of a memory cell is apt to be shortened due to increase in subthreshold current in a memory cell or leakage current in a PN junction as the operating temperature rises. It was therefore necessary to set the refresh cycle slightly shorter to compensate for the worst case at high temperature in order to ensure data retention. Thus, there was a problem that an excessive number of refresh operations is carried out at ordinary temperature to increase current consumption.

An oscillator circuit solving such a problem is disclosed in Japanese Patent Laying-Open No. 63-100698, for example.

FIG. 25 is a circuit diagram showing a structure of this oscillator circuit.

Referring to FIG. 25, an oscillator circuit includes three stages of inverters connected in a ring manner, and a thermistor S for feeding back the output of the inverter of the last stage to the inverter of the first stage. Each inverter includes P channel MOS transistors $Q_{P1}$, $Q_{P2}$ and $Q_{P3}$, and N channel MOS transistors $Q_{N1}$, $Q_{N2}$, and $Q_{N3}$.

Thermistor S is reduced in resistance as the temperature rises. Therefore, the charging/discharging operation with respect to the gates of transistors $Q_{P1}$ and $Q_{N1}$ is carried out more rapidly as the temperature rises to result in a shorter oscillation cycle. By using such an oscillator circuit for a refresh operation in a DRAM, the refresh cycle can be shortened as the operating temperature rises.

Similarly, a circuit is disclosed in Japanese Patent Laying-Open No. 4-192178 that has the refresh cycle shortened as the operating temperature rises by using a thermistor.

It is logically possible to alter the refresh cycle in response to a change in temperature according to the circuit. However, a substance decreased in resistance as the temperature rises, i.e. a material having a negative temperature coefficient, is seldom found in the natural world. Furthermore, even if there is a material having a negative temperature coefficient, the absolute value thereof is too small to alter sufficiently the refresh cycle in response to variation in temperature.

Japanese Patent Laying-Open No. 4-344387 discloses a circuit with a leak monitor having characteristics identical to that of a memory cell for initiating a refresh operation when the voltage of the storage node in the leak monitor becomes lower than a predetermined reference voltage. Charge storage in the leak monitor is rapidly lost as the operating temperature rises, similar to a normal memory cell. Therefore, a refresh operation is carried out appropriately in response to a shift in temperature.

Japanese Patent Laying-Open No. 61-139995 discloses a device that provides charge appropriately to the capacitor in the above-described leak monitor. A refresh operation is reliably initiated before data in a proper memory cell is lost.

Although a refresh operation is executed appropriately in response to a change in the operating temperature in the devices of the above-described publications, it is extremely difficult to determine the reference voltage of the storage node by which a reference operation is to be initiated. It is also difficult to respond to a rapid change in temperature since a refresh operation is executed only after the voltage of the storage node becomes lower than the reference voltage.

As mentioned above, it is required that ring oscillator 15 has a long oscillation cycle with low power consumption. In order to obtain an oscillation cycle of several µs, the on resistance of transistors forming each inverter in ring oscillator 15 must be set to approximately 1 MΩ. To realize such an on resistance, these transistors must have a gate length of tens of µm. Therefore, the gate capacitance per transistor is approximately 1 pF.

In the case of ring oscillator 15 formed of 7 stages of inverters shown in FIG. 23, a current i flowing within a time period of several µs is represented by the following equation 1 when the power supply voltage $V_{cc}$ is 3 V.

$$i = \frac{7 \times 1 \times 10^{-12} \times 3}{10^{-6}} = 21 \times 10^{-6} [A] \qquad \text{Equation 1}$$

Thus, it was difficult to lengthen the oscillation cycle of a ring oscillator while suppressing current consumption.

FIG. 26 is a circuit diagram showing a structure of an oscillator circuit disclosed in Japanese Patent Laying-Open No. 63-276316. Referring to FIG. 26, this oscillator circuit includes a reference voltage generation circuit 18 for generating two reference voltages, and an oscillator unit 19 for generating a clock signal $\phi_{CP}$ of a predetermined cycle. Oscillator unit 19 is formed by a ring oscillator including three inverters 191, 192 and 193.

According to this oscillator circuit, a voltage of power supply voltage $V_{cc}$ less the threshold voltage of P channel MOS transistor $Q_{P4}$ in reference voltage generation circuit 18 is applied to the gates of P channel MOS transistors $Q_{P5}$–$Q_{P7}$ in inverters 191–193, and a voltage of the ground voltage plus the threshold voltage of N channel MOS transistor $Q_{N4}$ is applied to the gates of N channel MOS transistors $Q_{N5}$–$Q_{N7}$. Therefore, a clock signal $\phi_{CP}$ of a predetermined cycle is constantly generated despite a change in the power supply voltage $V_{cc}$. The object of this oscillator circuit is to stabilize the oscillation cycle of a ring oscillator, and differs from the objects of the invention of the present application described in the following.

SUMMARY OF THE INVENTION

An object of the present invention is to provide an oscillator circuit having the frequency of a clock signal varied according to a change in operating temperature.

Another object of the present invention is to shorten a refresh cycle as the operating temperature rises.

A further object of the present invention is to reduce current consumption.

Still another object of the present invention is to provide a semiconductor device memory device having a refresh cycle shortened as the operating temperature rises by using a material having a positive temperature coefficient.

A still further object of the present invention is to rapidly alter a refresh cycle in response to a change in operating temperature.

Yet a further object of the present invention is to appropriately alter a refresh cycle continuously in response to a change in operating temperature.

Yet another object of the present invention is to alter a refresh cycle continuously in response to the amount of leakage current in a memory cell.

An oscillator circuit according to an aspect of the present invention includes a reference current generation circuit and an oscillator. The reference current generation circuit generates a reference current that varies in response to operating temperature. The oscillator generates a clock signal that has its cycle varied in response to the reference current.

An oscillator circuit according to another aspect of the present invention includes a reference current generation circuit and an oscillator. The reference current generation circuit includes a potential generation circuit, and a voltage-current conversion element. The potential generation circuit generates an output potential varying in response to operating temperature. The voltage-current conversion element generates a reference current that varies in response to the output potential. The oscillator includes an odd number of inverter circuits connected in a ring manner, and a circuit responsive to the reference current for supplying a charge current and/or a discharge current from at least one output node of the plurality of inverter circuits to an input node of an inverter circuit connected to that one output node. A clock signal is output from the output node of the inverter circuit of the last stage.

An oscillator circuit according to a further aspect of the present invention includes a reference current generation circuit and an oscillator. The reference current generation circuit includes a reference transistor through which a reference current varying in response to the operating temperature flows. The oscillator includes an odd number of a plurality of inverter circuits connected in a ring manner. Each of the plurality of inverter circuits includes an input node, an output node, and first and second transistors. The first transistor is connected between a first power supply potential node and the output node, and includes a control electrode connected to the input node. The second transistor is connected between the output node and a second power supply potential node, and includes a control electrode connected to the input node. At least one of the plurality of inverter circuits further includes a control transistor. The control transistor forms a current mirror circuit with the reference transistor, and is connected in series with the second transistor between the output node and the second power supply potential node. A clock signal is output from the output node of the inverter circuit of the last stage.

An oscillator circuit according to still another aspect of the present invention includes a reference current generation circuit and an oscillator. The reference current generation circuit includes a reference transistor through which a reference current varying in response to the operating temperature flows. The oscillator includes an odd number of a plurality of inverter circuits connected in a ring manner. Each of the plurality of inverter circuits includes an input node, an output node, and first and second transistors. The first transistor is connected between a first power supply potential node and the output node, and includes a control electrode connected to the input node. The second transistor is connected between the output node and a second power supply potential node, and includes a control electrode connected to the input node. At least one of the plurality of inverter circuits includes a control transistor. The control transistor forms a current mirror circuit with the reference transistor, and is connected in series with the first transistor, between the first power supply potential node and the output node. A clock signal is provided from the output node of the inverter circuit of the last stage.

An oscillator circuit according to a still further aspect of the present invention includes a reference current generation circuit and an oscillator. The reference current generation circuit includes a first reference transistor, and a second reference transistor. The first reference transistor includes a P channel MOS transistor, through which a reference current varying in response to the operating temperature flows. The second reference transistor includes an N channel MOS transistor, through which a reference current varying in response to the operating temperature flows. The oscillator includes an odd number of a plurality of inverter circuits connected in a ring manner. Each of the plurality of inverter circuits includes an input node, an output node, and first and second transistors. The first transistor is connected between a first power supply potential node and the output node, and includes a P channel MOS transistor having a control electrode connected to the input node. The second transistor is connected between the output node and a second power supply potential node, and includes an N channel MOS transistor having a control electrode connected to the input node. At least one of the plurality of inverter circuits further includes a first control transistor and a second control transistor. The first control transistor forms a current mirror circuit with the first reference transistor, and includes a P channel MOS transistor connected in series with the first transistor, between the first power supply potential node and the output node. The second control transistor forms a current mirror circuit with the second reference transistor, and includes an N channel MOS transistor connected in series with the second transistor between the output node and the second power supply potential node. A clock signal is provided from the output node of the inverter circuit of last stage.

A semiconductor memory device according to yet a further aspect of the present invention includes a memory cell array, an oscillator circuit, and a refresh circuit. The memory cell array includes a plurality of memory cells required for a refresh operation. The oscillator circuit includes a reference current generation circuit and an oscillator. The reference current generation circuit generates a reference current that varies in response to the operating temperature. The oscillator generates a clock signal varying in cycle in response to the reference current. The refresh circuit carries out a refresh operation for a plurality of memory cells in response to a clock signal.

A semiconductor memory device according to yet another aspect of the present invention includes a memory cell array, an oscillator circuit, and a refresh circuit. The memory cell array includes a plurality of memory cells required for a refresh operation. The oscillator circuit includes a reference current generation circuit and an oscillator. The reference current generation circuit includes a potential generation circuit and a voltage-current conversion element. The potential generation circuit generates an output potential varying in response to the operating temperature. The voltage-current conversion element generates a reference current varying in response to the output potential. The oscillator includes an odd number of a plurality of inverter circuits connected in a ring manner, and a circuit responsive to the reference current for supplying a charge current and/or a discharge current from at least one output node of the plurality of inverter circuits to an input node of an inverter circuit to which that output node is connected. A clock signal is provided from the output node of the inverter circuit of the last stage. The refresh circuit carries out a refresh operation for a plurality of memory cells in response to a clock signal.

A semiconductor memory device according to yet a still further aspect of the present invention includes a memory cell array, an oscillator circuit, and a refresh circuit. The memory cell array includes a plurality of memory cells required for a refresh operation. The oscillator circuit includes a reference current generation circuit and an oscillator. The reference current generation circuit includes a reference transistor through which a reference current varying in response to the operating temperature flows. The oscillator includes an odd number of a plurality of inverter circuits connected in a ring manner. Each of the plurality of inverter circuits includes an input node, an output node, and first and second transistors. The first transistor is connected between a first power supply potential node and the output node, and includes a control electrode connected to the input node. The second transistor is connected between the output node and a second power supply potential node, and includes a control electrode connected to the input node. At least one of the plurality of inverter circuits further includes a control transistor. The control transistor forms a current mirror circuit with the reference transistor, and is connected in series with the second transistor, between the output node and the second power supply potential node. A clock signal is provided from the output node of the inverter circuit of the last stage. The refresh circuit carries out a refresh operation for a plurality of memory cells in response to a clock signal.

A semiconductor memory device according to an additional aspect of the present invention includes a memory cell array, an oscillator circuit, and a refresh circuit. The memory cell array includes a plurality of memory cells required for a refresh operation. The oscillator circuit includes a reference current generation circuit and an oscillator. The reference current generation circuit includes a reference transistor through which a reference current varying in response to the operating temperature flows. The oscillator includes an odd number of a plurality of inverter circuits connected in a ring manner. Each of the plurality of inverter circuits includes an input node, an output node, and first and second transistors. The first transistor is connected between a first power supply potential node and the output node, and includes a control electrode connected to the input node. The second transistor is connected between the output node and a second power supply potential node, and includes a control electrode connected to the input node. At least one of the plurality of inverter circuits further includes a control transistor. The control transistor forms a current mirror circuit with the reference transistor, and is connected in series with the first transistor, between the first power supply potential node and the output node. A clock signal is provided from the output node of the inverter circuit of the last stage. The refresh circuit carries out a refresh operation for a plurality of memory cells in response to a clock signal.

A semiconductor memory device according to another aspect of the present invention includes a memory cell array, an oscillator circuit, and a refresh circuit. The memory cell array includes a plurality of memory cells required for a refresh operation. The oscillator circuit includes a reference current generation circuit and an oscillator. The reference current generation circuit includes a reference P channel transistor and a reference N channel transistor. A reference current varying in response to the operating temperature flows through the reference P channel transistor. A reference current varying in response to the operating temperature flows through the reference P channel transistor. A reference current varying in response to the operating temperature flows through the reference N channel transistor. The oscillator includes an odd number of a plurality of inverter circuits connected in a ring manner. Each of the plurality of inverter circuit includes an input node, an output node, a P channel transistor, and an N channel transistor. The P channel transistor is connected between a first power supply potential node and the output node, and includes a control electrode connected to the input node. The N channel transistor is connected between the output node and a second power supply potential node, and includes a control electrode connected to the input node. At least one of the plurality of inverter circuits further includes a control P channel transistor and a control N channel transistor. The control P channel transistor forms a current mirror circuit with the reference P channel transistor, and is connected in series with the P channel transistor, between the first power supply potential node and the output node. The control N channel transistor forms a current mirror circuit with the reference N channel transistor, and is connected in series with the N channel transistor, between the output node and the second power supply potential node. A clock signal is provided from the output node of the inverter circuit of the last stage. The refresh circuit carries out a refresh operation for a plurality of memory cells in response to a clock signal.

The above-described reference current generation circuit preferably includes a potential generation circuit and a voltage-current conversion element, wherein a reference current flows through first and second reference transistors in response to a current generated by the voltage-current conversion element. The potential generation circuit generates an output potential varying in response to the operating temperature. The voltage-current conversion element generates a current varying in response to an output potential.

The above-described potential generation circuit preferably includes a resistance circuit connected between a node for providing an output potential and a first power supply potential node, and having a positive temperature coefficient.

The above-described resistance circuit preferably includes a plurality of resistance elements and a plurality of program elements. The plurality of resistance elements have a positive temperature coefficient. The plurality of program elements are provided corresponding to the plurality of resistance elements for activating and deactivating respective corresponding resistance elements.

The reference current generation circuit preferably includes a capacitor element and a supply transistor, wherein a reference current flows through first and second reference transistors in response to a current flow in the supply transistor. The capacitor element includes one electrode connected to a predetermined potential node. The supply transistor is connected between the other electrode of the capacitor element and the first power supply potential node for supplying a current to the other electrode of the capacitor element.

The above-described oscillator circuit preferably includes a semiconductor substrate of one conductivity type on which the reference current generation circuit and the oscillator are formed. The above-described reference current generation circuit preferably includes a diode element, and a supply transistor, wherein a reference current flows through first and second reference transistors in response to a current flowing through the supply transistor. The diode element includes one electrode formed from the semiconductor substrate, the other electrode formed from a diffusion region of the other conductivity type, and a PN junction formed between the one electrode and the other electrode. The supply transistor is connected between the other electrode of the diode element and the first power supply potential node for supplying a current to the other electrode of the diode element.

The above-described oscillator circuit preferably includes a waveform shaping circuit. The waveform shaping circuit receives a clock signal from the oscillator to shape the waveform thereof.

The above-described waveform shaping circuit includes a first waveform shaping inverter circuit and a second waveform shaping inverter circuit. The first waveform shaping inverter circuit includes a first input node, a first output node, two first P channel transistors, and two first N channel transistors. The first input node receives a clock signal from the oscillator. The 2 first P channel transistors are connected in series between a first power supply potential node and the first output node. The 2 first N channel transistors are connected between the first output node and a second power supply potential node. The gate electrode of one of the 2 first P channel transistors gate electrode is connected to the first input node and the gate electrode of the other first P channel transistor is connected to the output node of an inverter circuit excluding the last stage. The gate electrode of one of the 2 first N channel transistors is connected to the first input node and the gate electrode of the other first N channel transistor is connected to the output node of one inverter circuit. The second waveform shaping inverter circuit includes a second input node, a second output node, 2 second P channel transistors, and 2 second N channel transistors. The second input node is connected to the first output node of the first waveform shaping inverter circuit. The second output node provides a clock signal having its waveform shaped. The 2 second P channel transistors are connected in series between the first power supply potential node and the second output node. The 2 second N channel transistors are connected between the second output node and the second power supply potential node. The gate electrode of the 2 second P channel transistors is connected to the second input node and the gate electrode of the other P channel transistor is connected to the input node of one inverter circuit. The gate electrode of the 2 second N channel transistors is connected to the second input node and the gate electrode of the other second N channel transistor is connected to the input node of one inverter circuit.

The above-described oscillator circuit preferably responds to a self refresh signal for providing or not providing a clock signal when the self refresh signal indicates or not indicates execution of a self refresh operation, respectively.

In the oscillator circuit according to the one aspect of the present invention, the reference current generation circuit generates a reference current varying in response to the operating temperature, whereby the oscillator generates a clock signal having the cycle varied in response to that reference current. Therefore, the cycle of a clock signal is shortened as the operating temperature rises.

In the oscillator circuit according to the another aspect of the present invention, the potential generation circuit generates an output potential varying in response to the operating temperature, whereby the voltage-current conversion element generates a reference current varying in response to that output potential. In response to this reference current, a charge current and/or a discharge current in at least one inverter circuit forming the oscillator is provided. Therefore, the cycle of a clock signal is shortened as the operating temperature rises.

In the oscillator circuit according to the further aspect of the present invention, the reference current flowing through the reference transistor varies in response to the operating temperature, whereby a current flows through the control transistor in the oscillator in response to the reference current. Therefore, the cycle of a clock signal is shortened as the operating temperature rises.

In the oscillator circuit according to the still another aspect of the present invention, the reference current flowing through the reference transistor varies in response to the operating temperature, whereby a current flows in the control transistor in response to the reference current. Therefore, the cycle of a clock signal is shortened as the operating temperature rises.

In the oscillator circuit according to the still further aspect of the present invention, the reference current flowing through the first and second reference transistors varies in response to the operating temperature, whereby a current flows in the first control transistor in response to the reference current flowing through the first reference transistor, and a current flows in the second control transistor in response to the reference current flowing through the second reference transistor. Therefore, the cycle of a clock signal is shortened as the operating temperature rises.

In the semiconductor memory device according to yet the further aspect of the present invention, a refresh operation of a memory cell is carried out in response to a clock signal from the above-described oscillator circuit. Therefore, the number of refresh operations is increased at high temperature where data retention of a memory cell is low, and the number of refresh operations is decreased at a low temperature where data retention is high. Therefore, a necessary and sufficient number of refresh operations are carried out in any operating temperature to reduce extra current consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2(a)–2(h) is a timing chart showing the operation of the oscillator circuit of FIG. 1.

FIGS. 3A and 3B are circuit diagrams showing the main components of an oscillator circuit of a DRAM according to a second embodiment of the present invention, where FIG. 3A shows another example of resistor RA in FIG. 1, and FIG. 3B shows another example of resistor RB of FIG. 1.

Figs. 4A and 4B show another examples of resistors RA and RB shown in FIG. 1, respectively.

Figs. 5A and 5B show other examples of resistors RA and RB of FIG. 1, respectively.

DESCRIPTION OF THE PREFERRED EMBODIMENTS

[Embodiment 1]

Figure 1:
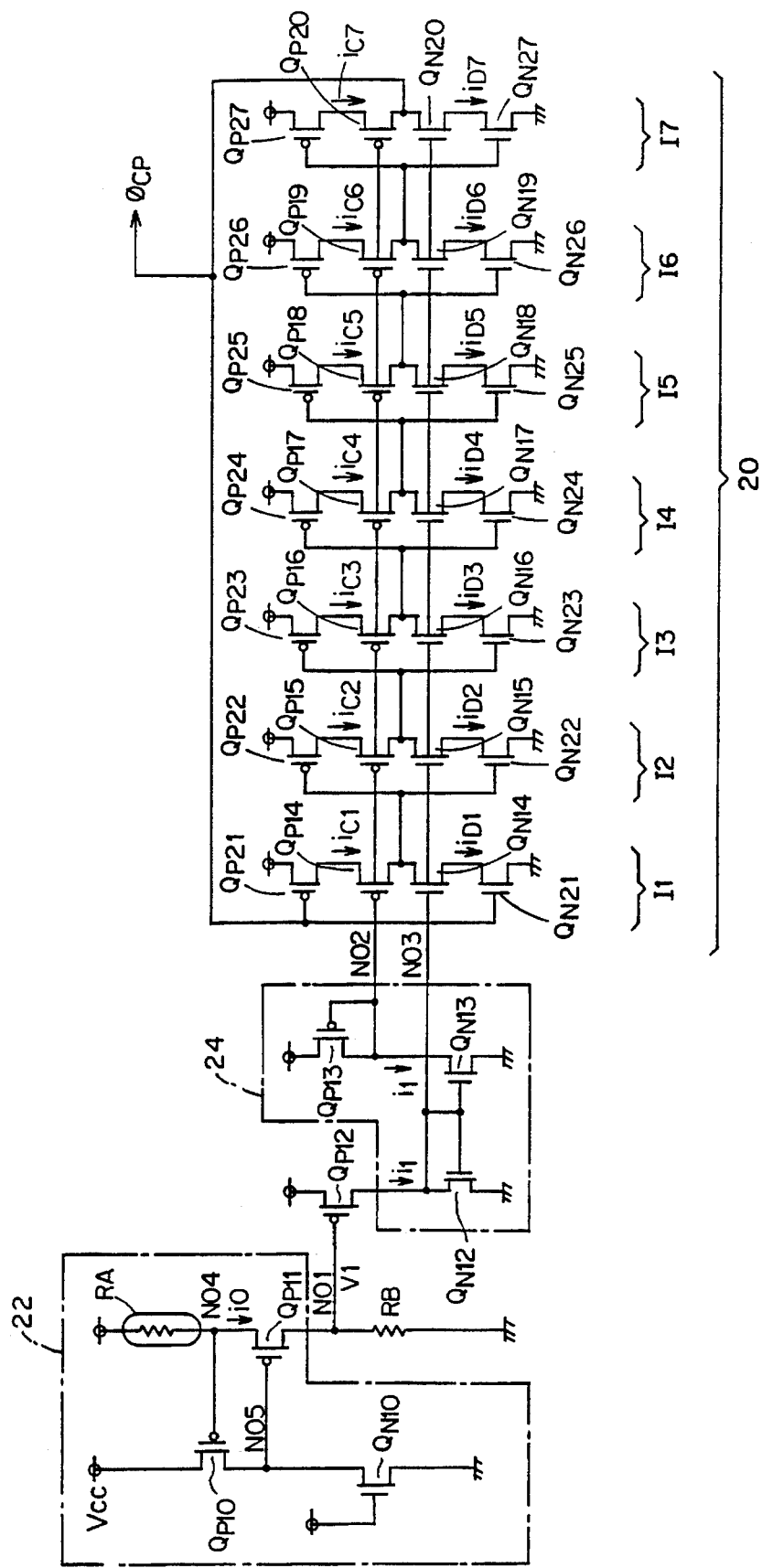
FIG. 1 is a circuit diagram showing an entire structure of an oscillator circuit of a DRAM according to a first embodiment of the present invention.

FIG. 1 is a circuit diagram showing a structure of an oscillator circuit generating a clock signal for controlling a refresh operation in a DRAM according to a first embodiment of the present invention. The entire structure of a DRAM according to Embodiment 1 is similar to the structure shown in FIG. 21.

Referring to FIG. 1, an oscillator circuit includes a ring oscillator 20, a current source 22, a resistor RB, a P channel MOS transistor $Q_{P12}$, and a control circuit 24.

Ring oscillator 20 includes 7 stages of complementary type MOS inverters I1–I7 for generating a clock signal $\phi_{CP}$ of a variable cycle. Inverters I1–I7 include P channel MOS transistors $Q_{P21}$–$Q_{P27}$ and N channel MOS transistors $Q_{N21}$–$Q_{N27}$, respectively. Inverters I1–I7 further include P channel MOS transistors $Q_{P14}$–$Q_{P20}$ connected between the drain electrodes of P channel MOS transistors $Q_{P21}$–$Q_{P27}$ and the output nodes of inverters I1–I7, and N channel MOS transistors $Q_{N14}$–$Q_{N20}$ connected between the drain electrodes of N channel MOS transistors $Q_{N21}$–$Q_{N27}$ and the output nodes of inverters I1–I7, respectively.

P channel MOS transistors $Q_{P21}$–$Q_{N27}$ become conductive when the input nodes of inverters I1–I7 attain a L level, whereby the gate electrodes of P channel MOS transistors $Q_{P21}$–$Q_{P27}$ and N channel MOS transistors $Q_{N21}$–$Q_{N27}$ of a subsequent stage of inverters I1–I7 are charged.

N channel MOS transistors $Q_{N21}$–$Q_{N27}$ become conductive when the input nodes of inverters I1–I7 attain an H level, whereby the gate electrodes of P channel MOS transistors $Q_{P21}$–$Q_{P27}$ and N channel MOS transistors $Q_{N21}$–$Q_{N27}$ of a subsequent stage of inverters I1–I7 are discharged.

Control circuit 24 includes an N channel MOS transistor $Q_{N12}$ connected between the drain electrode of P channel MOS transistor $Q_{P12}$ and the ground node, an N channel MOS transistor $Q_{N13}$ forming a current mirror with N channel MOS transistor $Q_{N12}$, and a P channel MOS transistor $Q_{P13}$ connected between the drain electrode of N channel MOS transistor $Q_{N13}$ and the power supply node.

P channel MOS transistor $Q_{P13}$ of control circuit 24 forms a current mirror circuit with P channel MOS transistors $Q_{P14}$–$Q_{P20}$ of ring oscillator 20. N channel MOS transistor $Q_{N12}$ of control circuit 24 forms a current mirror circuit with N channel MOS transistors $Q_{N14}$–$Q_{N20}$ of ring oscillator 20.

Current source 22 includes a P channel MOS transistor QP0 having its source connected to the power supply node, an N channel MOS transistor $Q_{N10}$ connected between the drain electrode of P channel MOS transistor $Q_{P10}$ and the ground node, and having the gate electrode connected to the power supply node, a resistor RA having a positive temperature coefficient, connected between the power supply node and the gate electrode of P channel MOS transistor $Q_{P10}$, and a P channel MOS transistor $Q_{P11}$ connected between the gate electrode of P channel MOS transistor $Q_{P10}$ and an output node NO1, and having the gate electrode connected to a node NO5 to which the drain electrodes of P channel MOS transistor $Q_{P10}$ and N channel MOS transistor $Q_{N10}$ are connected. Resistor RA having a positive temperature coefficient is formed of polysilicon, for example. Current source 22 generates a reference current $i_0$ that decreases as the operating temperature rises.

Resistor RB has a relatively small positive negative coefficient or a negative temperature coefficient, and is connected between output node NO1 of current source 22 and the ground node. Here, resistor RB having a negative temperature coefficient is formed of an N+diffusion layer, for example. Resistor RB serves to convert reference current $i_0$ supplied from current source 22 into a voltage V1.

P channel MOS transistor $Q_{P12}$ is connected between the power supply node and the drain electrode of N channel MOS transistor $Q_{N12}$ in control circuit 24, and has the gate electrode connected to output node NO1 of current source 22. Therefore, P channel MOS transistor $Q_{P12}$ functions to convert voltage V1 generated at node NO1 into a reference current $i_1$.

The operation of this oscillator circuit will be described hereinafter.

If P channel MOS transistor $Q_{P10}$ is non-conductive now, N channel MOS transistor $Q_{N10}$ is conductive, so that the potential of node of N5 substantially attains the ground level. Therefore, P channel MOS transistor $Q_{P11}$ conducts. Here, the value of reference current $i_0$ flowing to transistor $Q_{P11}$ is determined depending upon the values of resistors RA and RB, and the value of the resistance of transistor $Q_{P11}$.

As a result, the potential of node NO4 becomes lower than power supply level $V_{cc}$ by the voltage drop of resistor RA. P channel MOS transistor $Q_{P10}$ receiving this potential at its gate electrode attains a conductive state with a certain resistance. Therefore, current flows from the power supply node to the ground node via P channel MOS transistor $Q_{P10}$ and N channel MOS transistor $Q_{N10}$, whereby the potential of NO5 rises according to the resistance ratio of P channel MOS transistor $Q_{P10}$ to N channel MOS transistor $Q_{N10}$. The resistance of P channel MOS transistor $Q_{P11}$ that receives the potential of node NO5 at its gate electrode rises according to the increase of that gate potential. Here, N channel MOS transistor $Q_{N10}$ functions as a high resistance element to prevent the voltage level of node NO5 from rising to the level of power supply voltage $V_{cc}$.

When P channel MOS transistor $Q_{P11}$ approaches a non-conductive state according to the rise in the potential of node NO5, the potential of node NO4 rises, whereby P channel MOS transistor $Q_{P10}$ receiving the potential of node NO4 at its gate electrode is driven to a non-conductive state. This causes the resistance of P channel MOS transistor $Q_{P10}$ to rise, whereby the potential of node NO5 is slightly lowered.

As a result, current source 22 attains a stable state with P channel MOS transistors $Q_{P10}$ and $Q_{P11}$ slightly conducting. Therefore, reference current $i_0$ flowing to resistors RA and RB and P channel MOS transistor $Q_{P11}$ is stabilized. Potential v1 of node NO1 is also stabilized. Because P channel MOS transistor $Q_{P10}$ slightly conducts, the potential difference between the power supply node and the gate electrode of P channel MOS transistor $Q_{P10}$ becomes the threshold voltage $V_{THO}$ of P channel MOS transistor $Q_{P10}$.

This means that the voltage across resistor RA is the threshold voltage $V_{THO}$ of P channel MOS transistor $Q_{P10}$. Therefore, reference current $i_0$ flowing to resistor RB is represented by the following equation 2 where $R_0$ is the value of resistor RA.

$$i_0 = \frac{V_{TH0}}{R_0} \qquad \text{Equation 2}$$

Potential V1 of node NO1 is represented by the following equation 3 where $R_1$ is the value of resistor RB.

$$V1 = I_0 R_1 = V_{TH0} \cdot \frac{R_1}{R_0} \qquad \text{Equation 3}$$

Potential V1 of node NO1 is applied to the gate electrode of P channel MOS transistor $Q_{P12}$. As a result, a constant reference current $i_1$ always flows to P channel MOS transistor $Q_{P12}$. Therefore, a reference current $i_1$ of a value equal to reference current $i_1$ flowing through transistor $Q_{N12}$ flows to P channel MOS transistor $Q_{P13}$ and N channel MOS transistor $Q_{N13}$ by a current mirror circuit formed by transistors $Q_{N12}$ and $Q_{N13}$.

In ring oscillator 20, when the input node of inverter I of the first stage attains, for example, a L level, P channel MOS transistor $Q_{P21}$ and N channel MOS transistor $Q_{N21}$ of inverter $I_1$ are rendered conductive and non-conductive, respectively. As a result, a current $i_{C1}$ flows from the power supply node to the gate electrodes of P channel MOS transistor $Q_{P22}$ and N channel MOS transistor $Q_{N22}$ of inverter I2 of the second stage via P channel MOS transistors $Q_{P21}$ and $Q_{P14}$, whereby the gate electrodes are charged to a H level.

Here, current $i_{C1}$ flowing to P channel MOS transistor $Q_{P14}$ becomes equal to the value of reference current $i_1$ flowing to P channel MOS transistor $Q_{P13}$ since P channel MOS transistors $Q_{P13}$ and $Q_{P14}$ form a current mirror circuit.

When the input node of inverter I1 of the first stage attains a H level, P channel MOS transistor $Q_{P21}$ and N channel MOS transistor $Q_{N21}$ of inverter I1 are rendered non-conductive and conductive, respectively. As a result, a current $i_{D1}$ flows from the gate electrodes of P channel MOS transistor $Q_{P22}$ and N channel MOS transistor $Q_{N22}$ in inverter I2 of the second stage to the ground node via N channel MOS transistors $Q_{N14}$ and $Q_{N21}$.

Here, current $i_{D1}$ flowing through N channel MOS transistor $Q_{N14}$ becomes equal to reference current $i_1$ flowing through N channel MOS transistor $Q_{P12}$ since N channel MOS transistors $Q_{P12}$ and $Q_{P14}$ form a current mirror circuit.

Thus, currents $i_{C1}$–$i_{C7}$ flowing to P channel MOS transistors $Q_{P14}$–$Q_{P20}$ charge the gate electrodes of P channel MOS transistors $Q_{P21}$–$Q_{P27}$ and N channel MOS transistors $Q_{N21}$–$Q_{N27}$ in subsequent stages of inverters Ii–I7. Currents $i_{D1}$–$i_{D7}$ flowing to N channel M0S transistors $Q_{N14}$–$Q_{N20}$ discharge the gate electrodes of P channel MOS transistors $Q_{P21}$–$Q_{P27}$ and N channel MOS transistors $Q_{N21}$–$Q_{N27}$ in subsequent stages of inverters Ii–I7.

Therefore, the cycle of a clock signal $\phi_{CP}$ provided from ring oscillator 20 is determined by the values of currents $i_{C1}$–$i_{C7}$ and $i_{D1}$–$i_{D7}$. The charging and discharging rate is increased as the values of currents $i_{C1}$–$i_{C7}$ and $i_{D1}$–$i_{D7}$ becomes greater, so that the cycle of clock signal $\phi_{CP}$ becomes shorter. The charging and discharging rate is decreased as the values of currents $i_{C1}$–$i_{C7}$ and $i_{D1}$–$i_{D7}$ become smaller, so that the cycle of clock signal $\phi_{CP}$ becomes longer.

The operation in the case where operating temperature varies will be described hereinafter with reference to the timing chart of FIG. 2.

Since resistor RA has a positive temperature coefficient, the resistance thereof becomes greater as the operating temperature rises. Therefore, reference current $i_O$ provided from current source 22 is reduced. In contrast, the resistance of resistor RB is not so increased even if the operating temperature rises since resistor RB has a relatively small positive temperature coefficient or a negative temperature coefficient. Therefore, potential V1 of node N01 falls as reference current $i_O$ becomes lower.

Although the resistance of P channel MOS transistor $Q_{P12}$ is slightly increased as the temperature rises when the gate potential is constant, it is eventually reduced due to a greater fall of potential V1 applied to the gate electrode thereof. Therefore, reference current $i_1$ flowing to P channel MOS transistor $Q_{P12}$ increases as the operating temperature rises.

A reference current $i_1$ having a value equal to that of reference current $i_1$ flowing to N channel MOS transistor $Q_{N12}$ flows to P channel MOS transistor $Q_{P13}$ and N channel MOS transistor $Q_{N13}$ on account of a current mirror circuit formed by N channel MOS transistors $Q_{N12}$ and $Q_{N13}$.

Therefore, when the input node of inverter I1 of the first stage attains, for example, a L level, P channel MOS transistor $Q_{P21}$ conducts, whereby current $i_{C1}$ equal to reference current $i_1$ flowing through P channel MOS transistor $Q_{P13}$ flows to P channel MOS transistor $Q_{P14}$ by a current mirror circuit formed by P channel MOS transistors $Q_{P13}$ and $Q_{P14}$. Because current $i_{C1}$ flowing through P channel MOS transistor $Q_{P14}$ is greater than that flowing in the case of ordinary temperature, the gate electrodes of P channel MOS transistors $Q_{P22}$ and N channel MOS transistor $Q_{N22}$ in inverter I2 of the next stage are rapidly charged.

When the input node of inverter I1 of the first stage attains a H level, N channel MOS transistor $Q_{N21}$ conducts, whereby current $i_{D1}$ equal to reference current $i_1$ flowing to N channel MOS transistor $Q_{N12}$ of control circuit 24 flows to N channel MOS transistor $Q_{N14}$ by a current mirror formed by N channel MOS transistors $Q_{N12}$ and $Q_{N14}$. Because current $i_{D1}$ flowing to N channel MOS transistor $Q_{N14}$ is greater than that flowing in the case of an ordinary temperature, the gate electrodes of P channel MOS transistor $Q_{P22}$ and N channel MOS transistor $Q_{N22}$ of inverter I2 of the next stage are rapidly discharged.

Therefore, currents $i_{C1}-i_{C7}$ and $i_{D1}-i_{D7}$ flowing through inverters I1–I7 increase as the operating temperature rises. This causes the gate electrodes of transistors $Q_{P21}-Q_{P27}$ and $Q_{N21}-Q_{N27}$ forming respective converters I1–I7 to be rapidly charged/discharged, whereby the oscillation cycle of ring oscillator 20 is shortened. Thus, the cycle of clock signal $\phi_{CP}$ generated by ring oscillator 20 becomes shorter as the operating temperature rises.

Since a refresh operation is carried out in response to this clock signal $\phi_{CP}$, the refresh cycle is continuously shortened as the operating temperature rises. Although the data retaining time period of a memory cell becomes shorter as the operating temperature rises, the number of refresh operations per unit time increases, so that correct data is always maintained in a memory cell.

In contrast, the cycle of clock signal $\phi_{CP}$ output from ring oscillator 20 becomes longer as the operating temperature falls, so that the refresh cycle is continuously lengthened as the operating temperature falls. Although the data retaining time period of a memory cell is becomes longer as the operating temperature falls, refresh operation is carried out only for a necessary number of times, so that extra current consumption is reduced.

Thus, a DRAM including the above-described oscillator circuit has current consumption reduced because a refresh operation is carried out only for the necessary and sufficient number of times in any operating temperature.

When viewed from another aspect, currents $i_{C1}-i_{C7}$ and $i_{D1}-i_{D7}$ flowing through each of inverters I1–I7 are limited by P channel MOS transistors $Q_{P14}-Q_{P20}$ and N channel MOS transistors $Q_{N14}-Q_{N20}$. Therefore, the current consumption of ring oscillator 20 can be reduced without increasing the gate lengths of P channel MOS transistors $Q_{P21}-Q_{P27}$ and N channel MOS transistors $Q_{N21}-Q_{N27}$.

For example, even if the gate capacitance of each of transistors $Q_{P21}-Q_{P27}$ and $Q_{N21}-Q_{N27}$ is set to approximately 0.01 pF with a reference current $i_1$ of approximately 1 μA in ordinary temperature, the cycle of clock signal $\phi_{CP}$ can be set to several μs. Here, the charge/discharge current i is represented by the following equation 4.

$$i = \frac{7 \times 0.01 \times 10^{-12} \times 3}{10^{-6}} = 0.2 \times 10^{-6} [A] \qquad \text{Equation 4}$$

Because a current of approximately 1 μA flows respectively to transistors $Q_{N12}$, $Q_{P13}$ and $Q_{N13}$ in addition to this charge/discharge current i, the total current consumption of ring oscillator becomes 2.2 μA which is lower than that of a conventional case.

Thus, according to Embodiment 1, the refresh cycle is continuously shortened as the operating temperature rises, whereby a refresh operation is carried out by the necessary and sufficient number of times per unit time period to reduce extra current consumption.

The present invention is extremely effective for practical usage since a resistor RA having a positive temperature coefficient is used. Furthermore, because there are many resistors having a positive temperature coefficient in the natural world, an optimized refresh cycle can be obtained according to the characteristics of a manufactured DRAM. Although a material having a sufficiently high negative temperature coefficient is rare, there are many materials having a sufficient high temperature coefficient. Therefore, sufficient variation of a refresh cycle in response to a change in the operating temperature is enabled readily.

In Embodiment 1, current source 22, resistor RB, P channel MOS transistor $Q_{P12}$ and control circuit 24 form reference current generation means. Ring oscillator 20 forms oscillator means. Current source 22 and resistor RB form potential generation means. P channel MOS transistor $Q_{P12}$ form voltage-current conversion means. P channel MOS transistor $Q_{P13}$ and N channel MOS transistor $Q_{N12}$ of control circuit 24 respectively form a reference transistor in reference current generation means.

[Embodiment 2]

FIGS. 3A and 3B are circuit diagrams showing a second embodiment of the present invention, where FIGS. 3A and 3B show modifications of resistors RA and RB, respectively, of FIG. 1.

Although the above-described Embodiment 1 can have the refresh cycle shortened as the operating temperature rises, variation is inevitable in the manufacturing process since all the elements of the DRAM are formed on a semiconductor substrate. The data retaining ability of a memory cell and the temperature dependence of resistors and transistors cannot be defined accurately unless the elements are actually formed on the semiconductor substrate. It is therefore extremely difficult to estimate optimum values for resistors RA and RB in advance.

An effective approach is considered of forming a plurality of elements redundantly on a semiconductor substrate to activate and deactivate any of the elements according to the characteristics of the manufactured DRAM.

Referring to FIG. 3A, resistor RA includes resistors $RA_0$–$RA_N$ and N fuses F. Resistors $RA_0$–$RA_N$ are connected in series. Each fuse F is connected parallel to resistors $RA_1$–$RA_N$.

Therefore, resistors RA-RA are respectively short-circuited when all fuses F are not blown out. Thus, resistor RA has the value of resistor $RA_0$ as a whole. The value of resistor RA can be selectively increased by blowing out any of fuses F.

Referring to FIG. 3B, resistor RB includes resistors $RB_0$–$RB_N$ and N fuses F. The structure of resistor RB is similar to that of resistor RA shown in FIG. 3A.

According to Embodiment 2, the values of resistors RA and RB can be selectively varied by appropriately blowing out fuses F connected parallel thereto. Thus, a refresh operation can be executed at an optimum cycle according to the characteristics of the manufactured DRAM. In Embodiment 2, fuse F forms a program element.

[Embodiment 3]

Figure 4A:
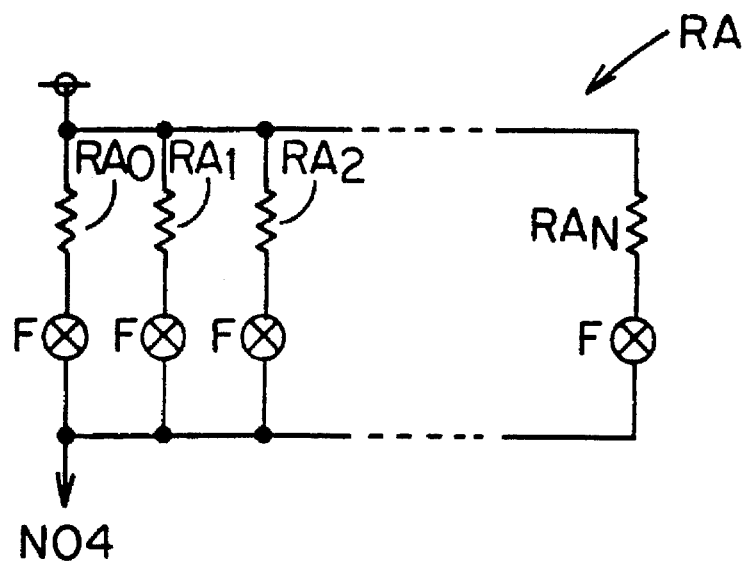
FIGS. 4A and 4B are circuit diagrams showing the main components of an oscillator circuit of a DRAM according to a third embodiment of the present invention, where
Figure 4B:
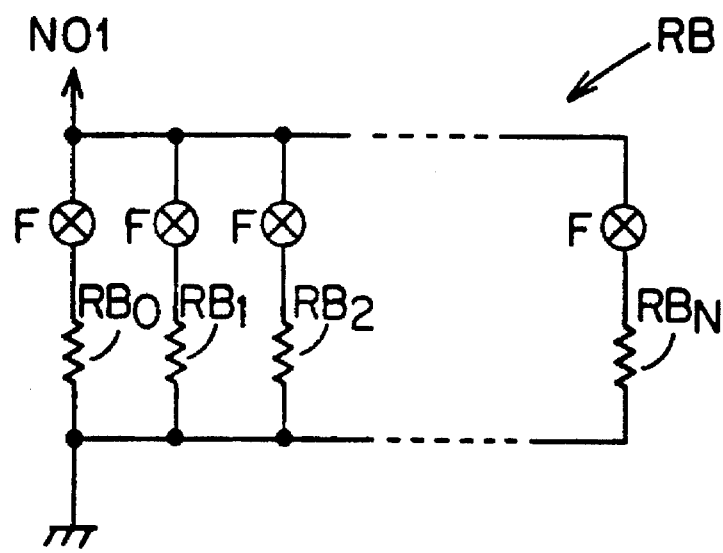

FIGS. 4A and 4B are circuit diagrams showing a third embodiment of the present invention, where FIGS. 4A and 4B show other examples of resistors RA and RB, respectively, of FIG. 1.

Referring to FIG. 4A, resistor RA includes resistors $RA_0$–$RA_N$ and a plurality of fuses F. Each fuse F is connected in series with each of resistors $RA_0$–$RA_N$. Respective series of each of resistors $RA_0$–$RA_N$ and each of fuse F are connected in parallel.

When not all fuses F are blown out, the value of resistor RA becomes the value of resistors $RA_0$–$RA_N$ formed in parallel. The value of resistor RA can be selectively increased by appropriately blowing out any fuse F.

Referring to FIG. 4B, resistor RB includes resistors $RB_0$–$RB_N$ and a plurality of fuses F. The structure of resistor RB is similar to that of resistor RA shown in FIG. 4A.

Resistors $RA_0$–$RA_N$ and $RB_0$–$RB_N$ formed in redundancy may be connected in series or in parallel. In Embodiment 3, fuse F forms a program element.

[Embodiment 4]

FIGS. 4A and 4B are circuit diagrams of a fourth embodiment of the present invention, where FIGS. 4A and 4B show other examples of resistors RA and RB, respectively, of FIG. 1.

Figure 5A:
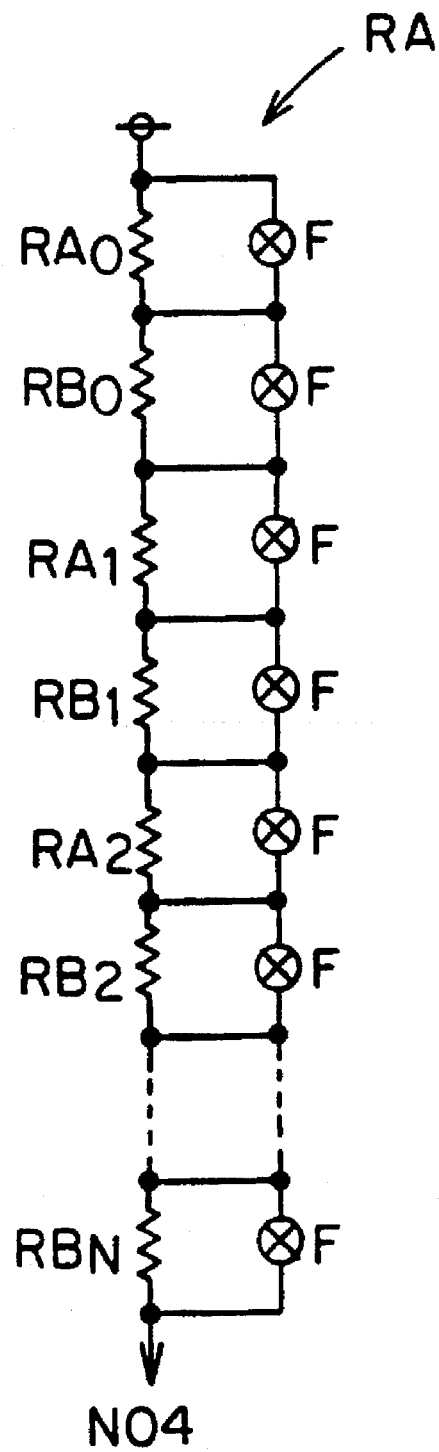
FIGS. 5A and 5B are circuit diagrams showing the main components of an oscillator circuit of a DRAM according to a fourth embodiment of the present invention where

Referring to FIG. 5A, resistor RA includes resistors $RA_0$–$RA_N$ having a predetermined temperature coefficient, resistors $RB_0$–$RB_N$ having a different predetermined temperature coefficient, and 2 (N+1) fuses F. Resistors $RA_0$–$RA_N$ and $RB_0$–$RB_N$ are all connected in series. Fuses F are connected parallel to resistors $RA_0$–$RA_N$ and $RB_0$–$RB_N$ respectively.

Figure 5B:
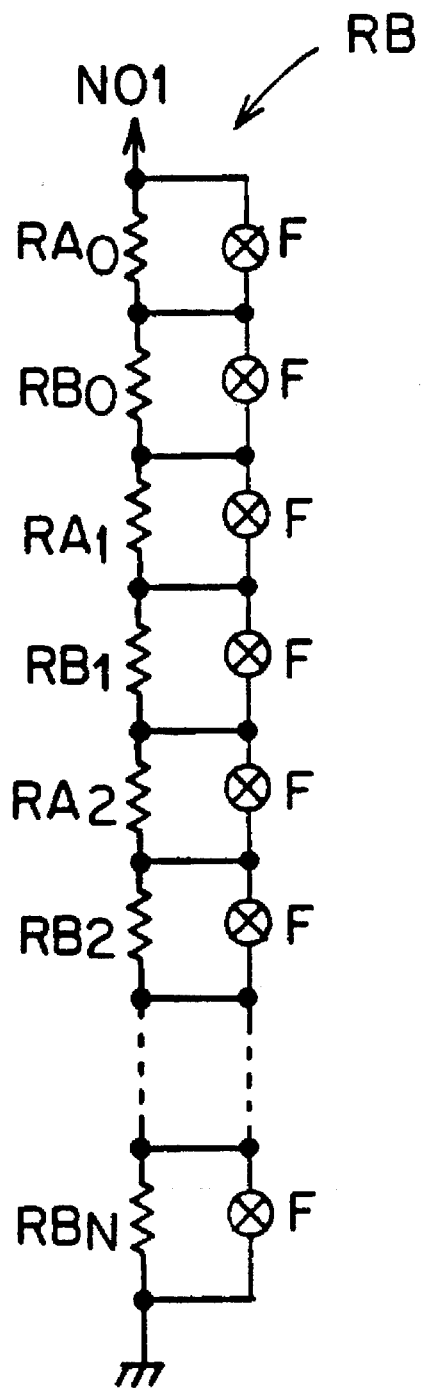

Referring to FIG. 5B, resistor RB includes resistors $RA_0$–$RA_N$ having a predetermined temperature coefficient, resistors $RB_0$–$RB_N$ having a different predetermined temperature coefficient, and 2 (N+1) fuses F. Resistors $RA_0$–$RA_N$ and $RB_0$–$RB_N$ are all connected in series. Fuses F are connected parallel to resistors $RA_0$–$RA_N$ and $RB_0$–$RB_N$, respectively.

According to Embodiment 4, resistors RA and RB include resistors having different temperature coefficients, so that not only the resistance, but also the temperature characteristics of resistors RA and RB can be set to optimum values. Therefore, a refresh operation can be executed according to the characteristics of a manufactured DRAM more accurately than those of Embodiments 2 and 3.

It is apparent from Embodiment 4 that all resistors $RA_0$–$RA_N$ may have the same or different values. This also applies to resistors $RB_0$–$RB_N$. In Embodiment 4, fuse F forms a program element.

[Embodiment 5]

Figure 6:
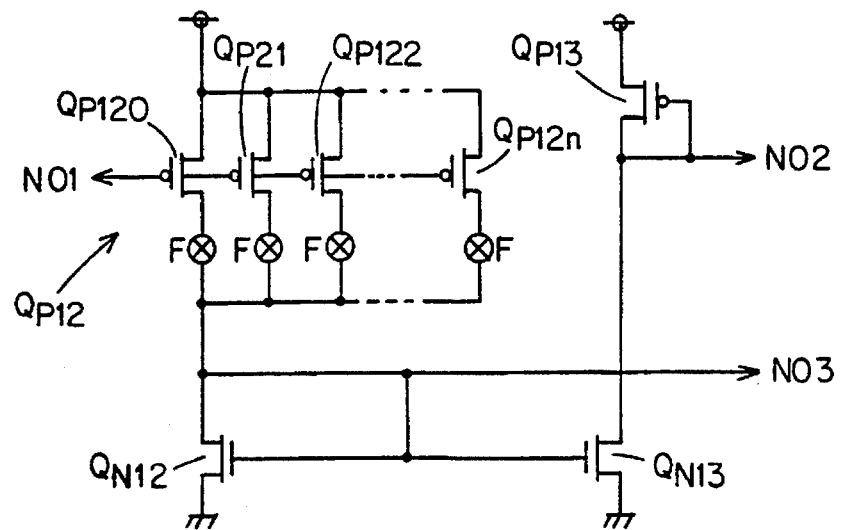
FIGS. 6 and 7 are circuit diagrams of the main components of an oscillator circuit of a DRAM according to a fifth embodiment and a sixth embodiment, respectively, particularly showing other examples of a P channel MOS transistor for voltage-current conversion shown in FIG. 1.

FIG. 6 shows a fifth embodiment of the present invention differing from Embodiment 1 shown in FIG. 1 in transistor $Q_{P12}$. Referring to FIG. 6, P channel MOS transistor $Q_{P12}$ serving as current-voltage conversion means includes P channel MOS transistors $Q_{P120}$–$Q_{P12n}$, and a plurality of fuses F. Fuses F are connected in series with transistors $Q_{P120}$–$Q_{P12n}$, respectively. Transistors $Q_{P120}$–$Q_{P12n}$ and fuses F are connected parallel to each other.

By appropriately blowing out any of fuses F in Embodiment 5, the resistance of transistor $Q_{P12}$ can be selectively increased. More specifically, the size of transistor $Q_{P12}$ can be selectively specified. Thus, a refresh operation can be executed with an optimum cycle according to the characteristics of a manufactured DRAM. In Embodiment 5, fuse F forms a program element.

[Embodiment 6]

Figure 7:
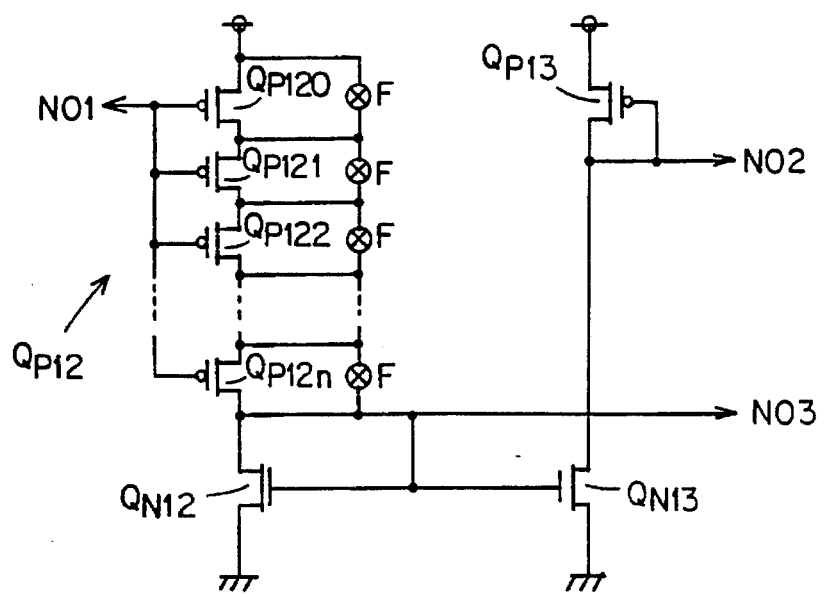

FIG. 7 shows a sixth embodiment of the present invention, differing from Embodiment 1 shown in FIG. 1 in transistor $Q_{P12}$. Referring to FIG. 7, P channel MOS transistor $Q_{P12}$ which is a voltage-current conversion means includes P channel MOS transistors $Q_{P120}$–$Q_{P12n}$ and a plurality of fuses. Transistors $Q_{P120}$–$Q_{P2n}$ are all connected in series. Fuses F and transistors $Q_{P120}$–$Q_{P12n}$ are connected in parallel respectively.

By appropriately blowing out any of fuses F in Embodiment 6, the resistance of transistor $Q_{P12}$ can be selectively increased. More specifically, the size of transistor $Q_{P12}$ can be selectively set. Thus, a refresh operation can be executed as an optimum cycle according to the characteristic of a manufactured DRAM. In Embodiment 6, fuse F forms a program element.

[Embodiment 7]

Figure 8:
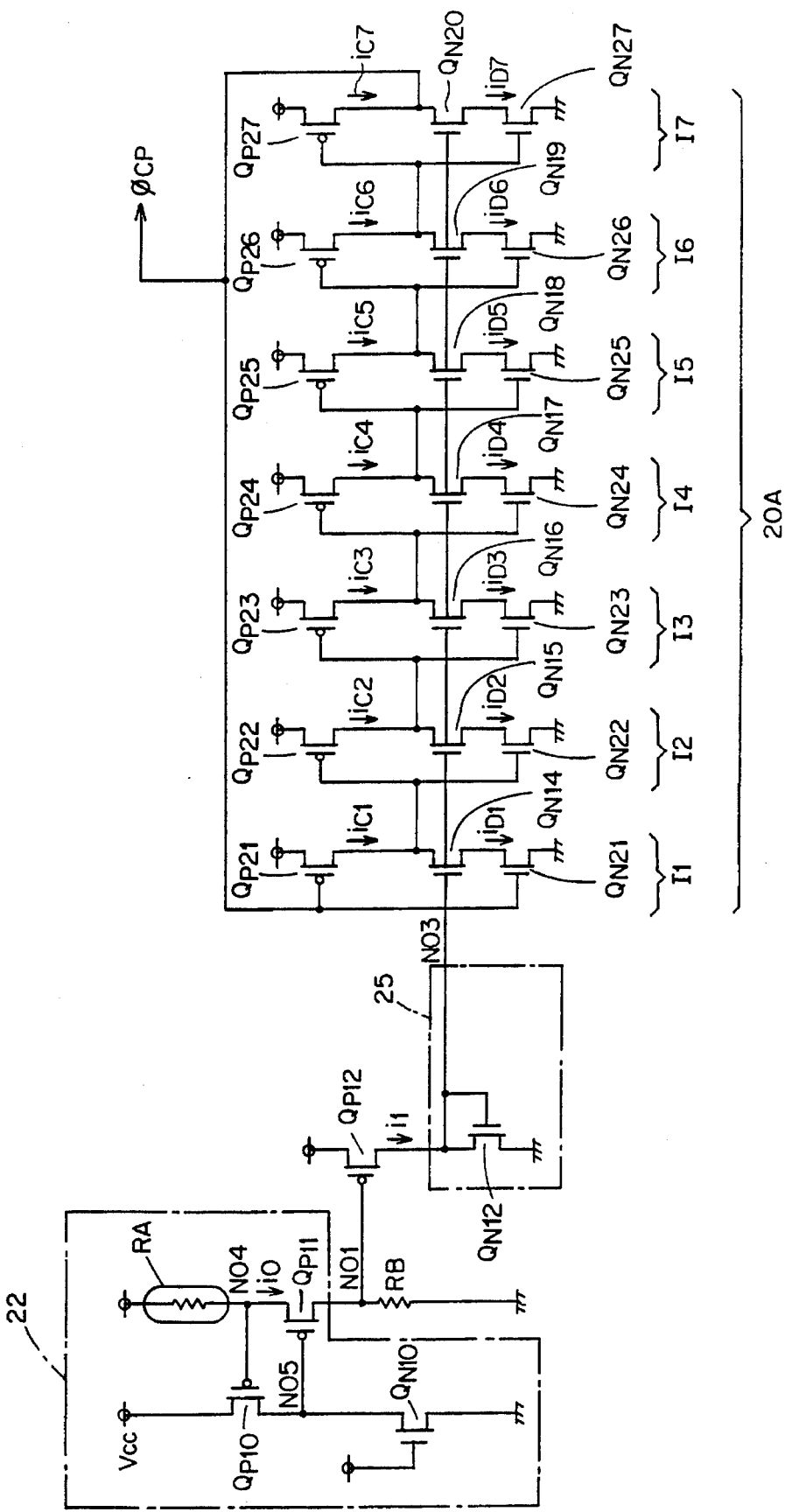
FIGS. 8–13 are circuit diagrams showing the entire structure of an oscillator circuit of a DRAM according to 7–12th embodiments of the present invention, respectively.
Figure 22:
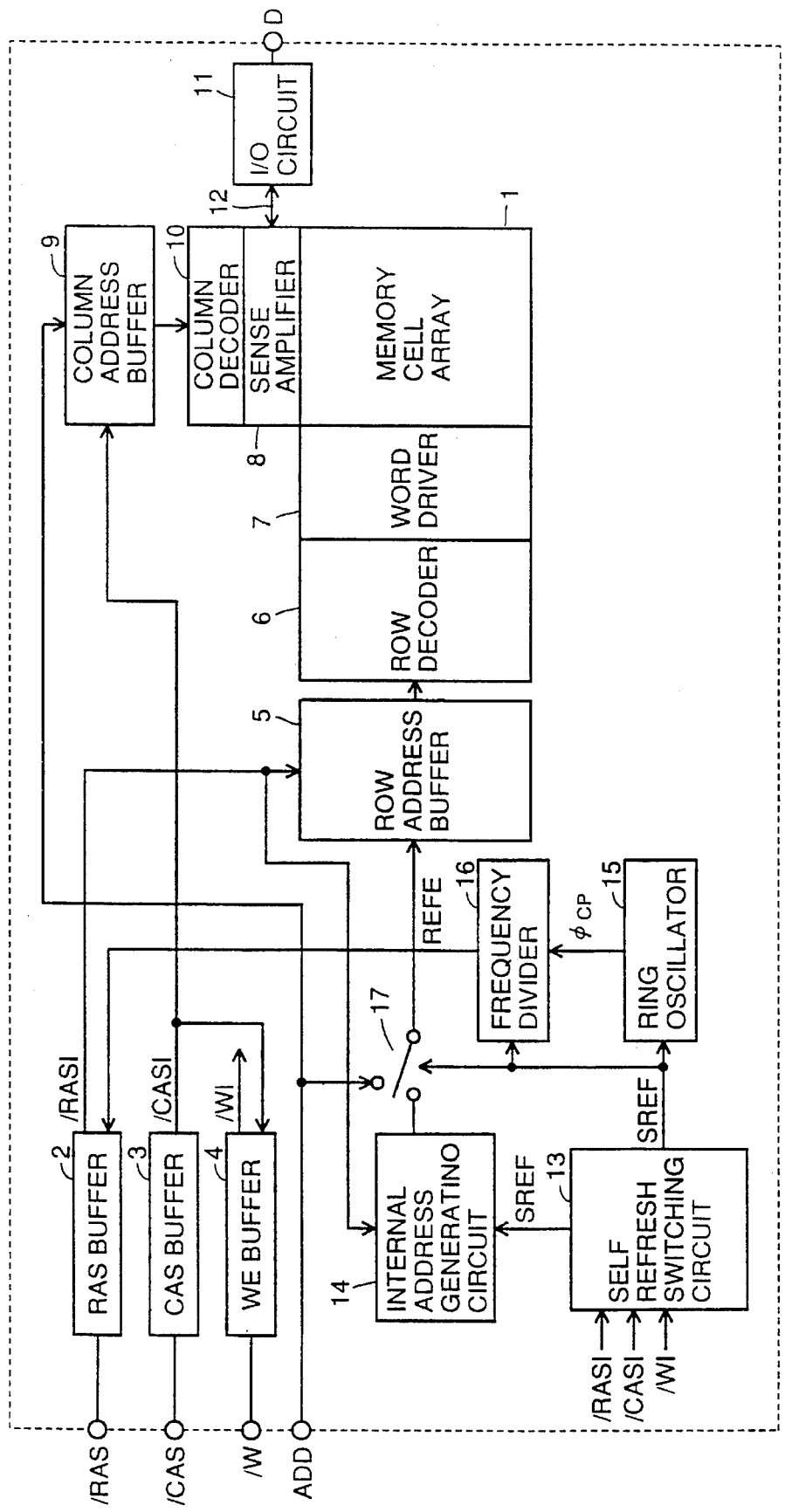
FIG. 22 is a block diagram showing an entire structure of a conventional DRAM.
Figure 23:
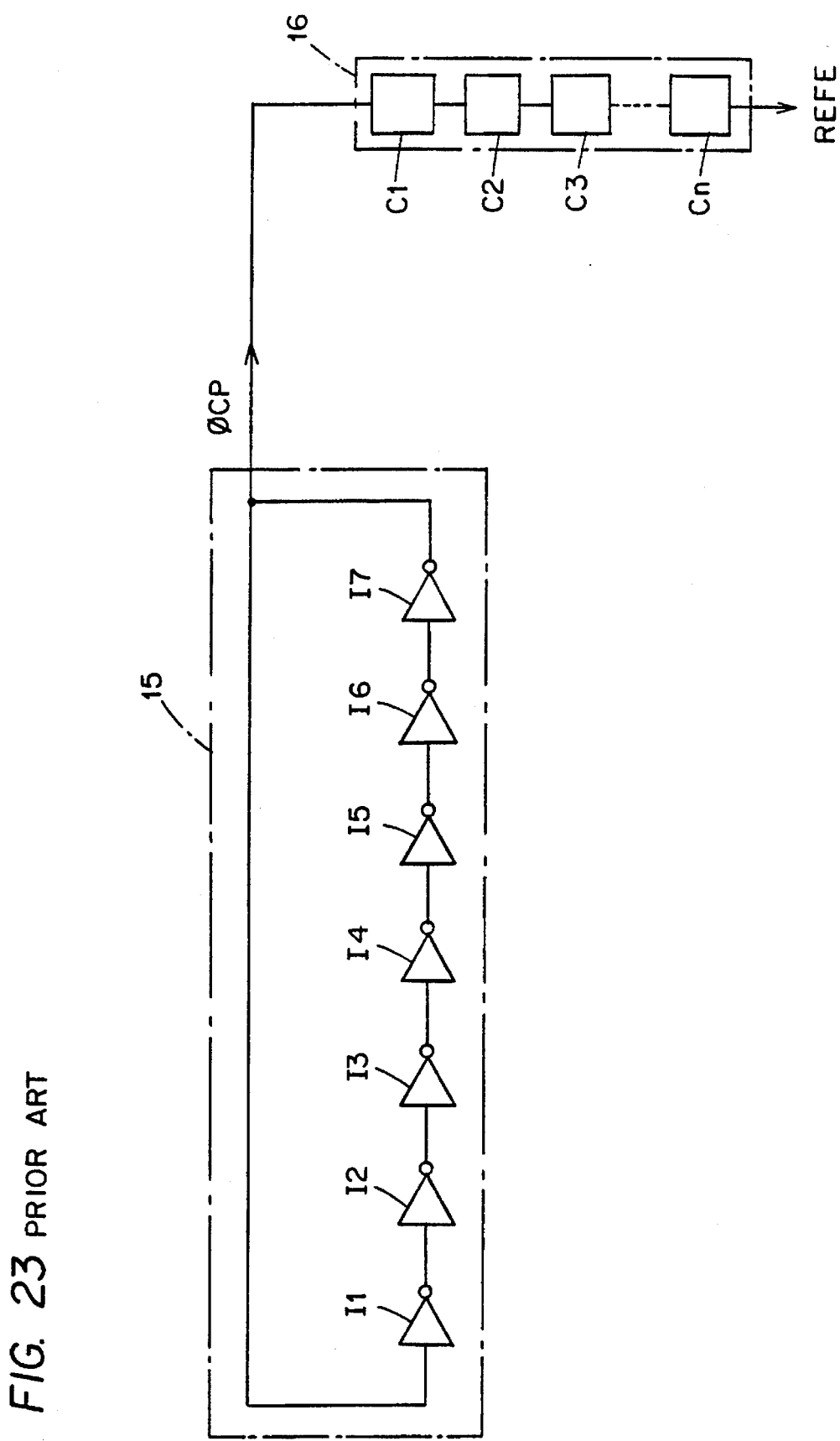
FIG. 23 is a block diagram showing a ring oscillator and a frequency divider of the DRAM shown in FIG. 22.
Figure 24:
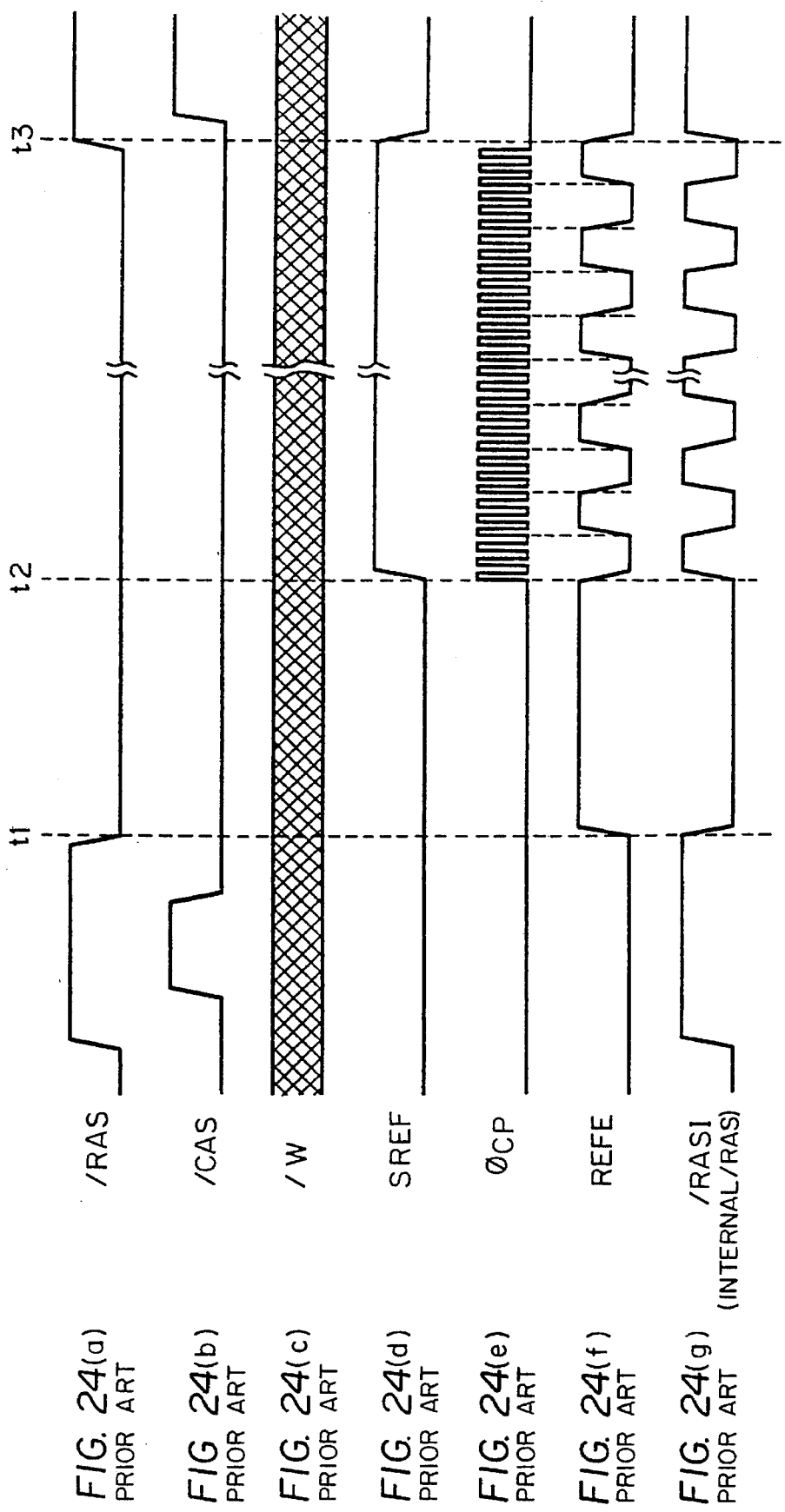
FIG. 24(a)–24(g) is a timing chart showing the operation of the DRAM of FIG. 22.
Figure 25:
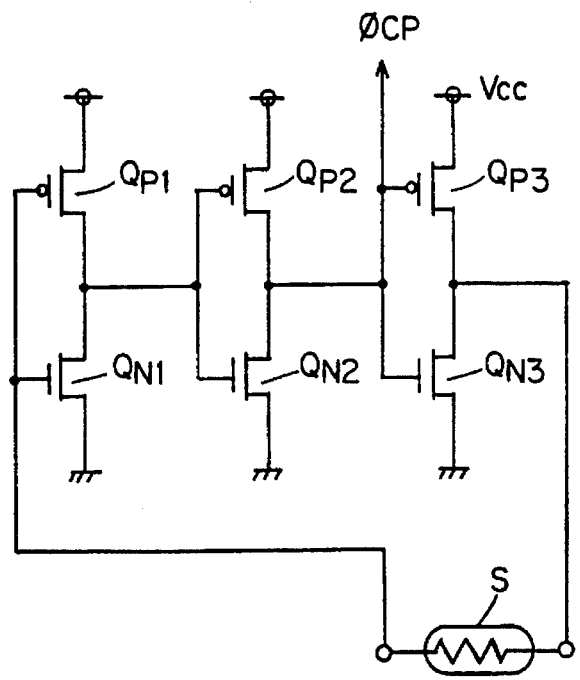
FIG. 25 is a circuit diagram showing an example of a ring oscillator in a conventional DRAM.
Figure 26:
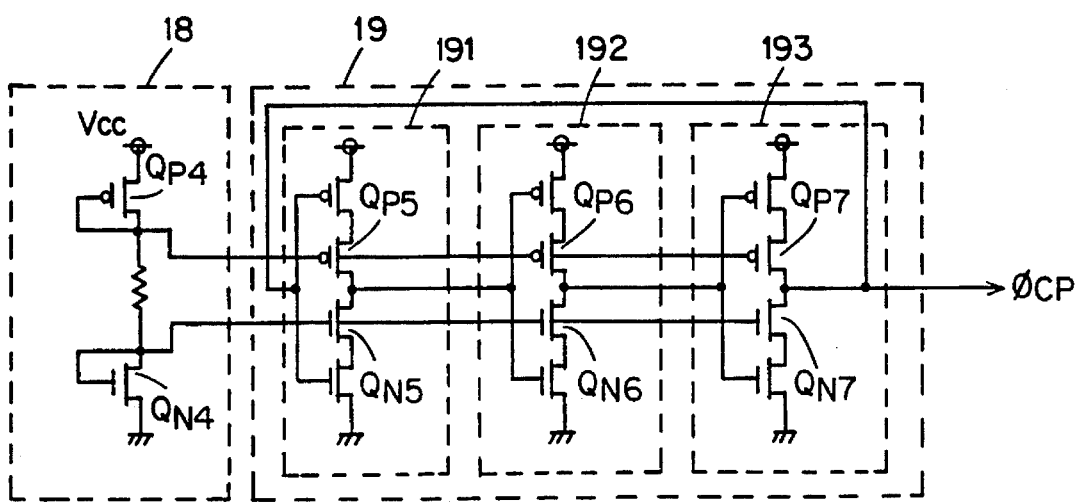
FIG. 26 is a circuit diagram showing an example of a conventional ring oscillator.

FIG. 8 is a circuit diagram showing a structure of an oscillator circuit of a DRAM according to a seventh embodiment of the present invention. The entire structure of the DRAM of Embodiment 7 is similar to that shown in FIG. 22.

Referring to FIG. 8, an oscillator circuit includes a ring oscillator, a current source 22, a resistor RB, a P channel MOS transistor $Q_{P12}$, and a control circuit 25. The oscillator circuit of Embodiment 7 differs from that of Embodiment 1 in ring oscillator 20A and control circuit 25.

Ring oscillator 20A includes 7 inverters I1–I7 connected in a ring manner. Each of inverters I1–I7 includes P channel MOS transistors $Q_{P21}$–$Q_{P27}$ and N channel MOS transistors $Q_{N21}$–$Q_{N27}$.

Each of inverters I1–I7 further includes N channel MOS transistors $Q_{N14}$–$Q_{N20}$ between the output node and the drain electrodes of N channel MOS transistors $Q_{N21}$–$Q_{N12}$. Each of inverters I1–I7 in Embodiment 7 lacks a P channel MOS transistor between the output node and the drain electrodes of P channel MOS transistors $Q_{P21}$–$Q_{P27}$.

Control circuit 25 includes a diode-connected N channel MOS transistor $Q_{N12}$ connected between the drain electrode of P channel MOS transistor $Q_{P12}$ and the ground node. The gate electrode of transistor $Q_{N12}$ is connected to all the gate electrodes of N channel MOS transistors $Q_{N14}$–$Q_{N20}$ in inverters I1–I7.

When the input node of inverter I1 of the first stage attains, for example, a L level in Embodiment 7, P channel MOS transistor $Q_{P21}$ is rendered conductive, and N channel MOS transistor $Q_{N21}$ is rendered non-conductive. This causes charge current $i_{C1}$ to flow from the power supply node to the gate electrodes of P and N channel MOS transistors $Q_{P22}$ and $Q_{N22}$ of inverter I2 of the second state via transistor $Q_{P12}$.

When the input node of inverter I1 of the first stage attains a H level, P channel MOS transistor $Q_{P21}$ is rendered non-conductive and N channel MOS transistor $Q_{N21}$ is rendered conductive. This causes discharge current $i_{D1}$ to flow from the gate electrodes of P and N channel MOS transistors $Q_{P22}$ and $Q_{N22}$ of inverter I2 of the second stage to the ground node via the two transistors $Q_{N14}$ and $Q_{N21}$.

Since N channel MOS transistor $Q_{N12}$ of control circuit 25 and respectively N channel MOS transistors $Q_{N14}$–$Q_{N20}$ of inverters I1–I7 form current mirror circuits, discharge currents $i_{D1}$–$i_{D7}$ become equal to reference current $i_1$ flowing through N channel MOS transistor $Q_{N12}$. Because this reference current $i_1$ increases as the operating temperature rises, discharge currents $i_{D1}$–$i_{D7}$ also increase according to a rise in the operating temperature. As a result, the discharge rate in ring oscillator 20A is increased, whereby the cycle of clock signal $\phi_{CP}$ becomes shorter as the operating temperature rises.

The cycle of clock signal $\phi_{CP}$ generated by the oscillator circuit of Embodiment 7 is shorter than that of the oscillator circuit of Embodiment 1. This is because charge currents $i_{C1}$–$i_{C7}$ towards the gate electrodes of P and N channel MOS transistors $Q_{P21}$–$Q_{P27}$ and $Q_{N21}$–$Q_{N27}$ forming inverters I1–I7 of a subsequent stage is not limited.

However, the current consumption is reduced since reference current $i_1$ flows through only one path. For example, when reference current $i_0$ supplied from current source 22 is set to approximately 1 μA, the consumed reference current $i_1$ becomes 1 μA which is half of that in Embodiment 1.

Thus, each of inverters I1–I7 may have only the N channel MOS transistors $Q_{N21}$–$Q_{N27}$ side connected to N channel MOS transistors $Q_{N14}$–$Q_{N20}$ limiting the discharge current thereof.

In Embodiment 7, current source 22, resistor RB, P channel MOS transistor $Q_{P12}$ and control circuit 25 form reference current generation means. Ring oscillator 20A form oscillator means. Current source 22 and resistor RB formed potential generation means. P channel MOS transistor $Q_{P12}$ form voltage-current conversion means. N channel MOS transistor $Q_{N12}$ of control circuit 25 form a reference transistor in reference current generation means.

[Embodiment 8]

Figure 9:
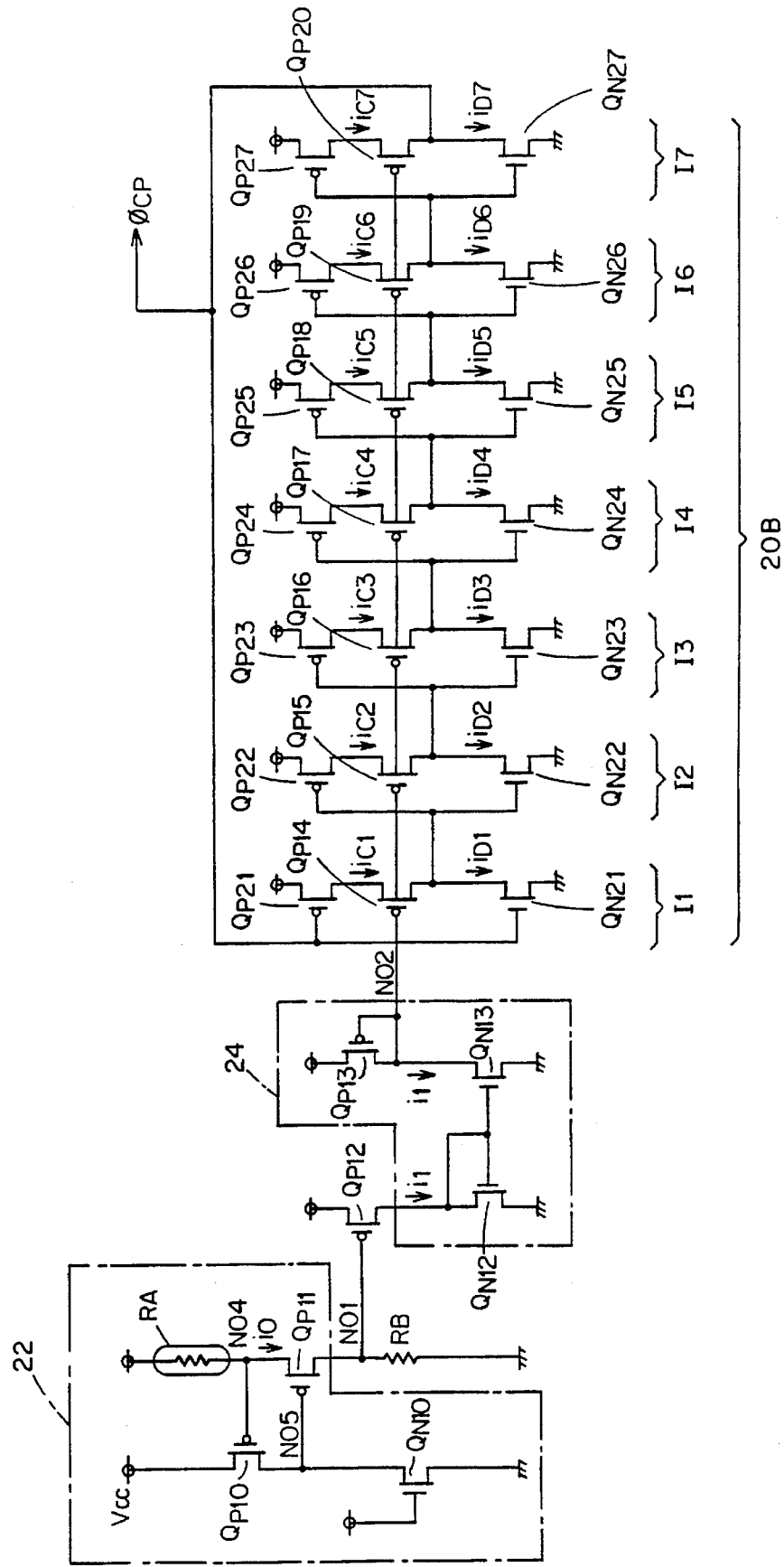

FIG. 9 is a circuit diagram showing a structure of an oscillator circuit of a DRAM according to an eighth embodiment of the present invention. The entire structure of the DRAM according to Embodiment 8 is similar to that shown in FIG. 22.

Referring to FIG. 9, an oscillator circuit includes a ring oscillator 20, a current source 22, a resistor RB, a P channel MOS transistor $Q_{P12}$, and a control circuit 27. The oscillator circuit of Embodiment 8 differs from that of Embodiment 1 in ring oscillator 20B.

Ring oscillator 20B includes seven inverters I1–I7 connected in a ring manner. Each of inverters I1–I7 includes P channel MOS transistors $Q_{P21}$–$Q_{P27}$, and N channel MOS transistors $Q_{N21}$–$Q_{N27}$.

Each of inverters I1–I7 further includes P channel MOS transistors $Q_{P14}$–$Q_{P20}$ connected between the output node and the drain electrodes of P channel MOS transistors $Q_{P21}$–$Q_{P27}$. P channel MOS transistors $Q_{P14}$–$Q_{P20}$ form current mirrors with P channel MOS transistor $Q_{P13}$ in control circuit 24.

When the input node of inverter I1 of the first stage attains a L level in ring oscillator 20B, P channel MOS transistor $Q_{P21}$ is rendered conductive, and N channel MOS transistor $Q_{N21}$ is rendered non-conductive. As a result, charge current $i_{C1}$ flows from the power supply node to the gate electrodes of P and N channel MOS transistors $Q_{P22}$ and $Q_{N22}$ of inverter I2 of the second stage via two transistors $Q_{P21}$ and $Q_{P14}$.

When the input node of inverter I1 of the first stage attains a H level, P channel MOS transistor $Q_{P21}$ is rendered non-conductive, and N channel MOS transistor $Q_{N21}$ is rendered conductive. As a result, discharge current $i_{D1}$ flows from the gate electrodes of P and N channel MOS transistors $Q_{P22}$ and $Q_{N22}$ of inverter I2 of the second stage towards the ground node via transistor $Q_{N21}$.

Because P channel MOS transistors $Q_{P13}$ and $Q_{P14}$ form a current mirror circuit, the above-described charge current $i_{C1}$ becomes equal to reference current $i_1$ flowing to transistor $Q_{P13}$. Furthermore, because N channel MOS transistors $Q_{N12}$ and $Q_{N13}$ form a current mirror circuit, reference current $i_1$ becomes equal to reference current $i_1$ flowing to transistor $Q_{N12}$.

Since reference current $i_1$ flowing to N channel MOS transistor $Q_{N12}$ increases as the operating temperature rises, charge current $i_{C1}$ also increases as the operating temperature rises. Thus, the charge rate in ring oscillator 20B is increased to shorten the cycle of clock signal $\phi_{CP}$.

The cycle of clock signal $\phi_{CP}$ generated by the oscillator circuit of Embodiment 8 is shorter than that of the oscillator circuit of Embodiment 1. This is because discharge currents $i_{D1}$–$i_{D7}$ from the gate electrodes of P and N channel MOS transistors $Q_{P21}$–$Q_{P27}$ and $Q_{N21}$–$Q_{N27}$ forming inverters Ii–I7 of a subsequent stage are limited.

Thus, each inverters Ii–I7 may have only the P channel MOS transistors $Q_{P21}$–$Q_{P27}$ side connected to P channel MOS transistors $Q_{P14}$–$Q_{P20}$ for limiting charge currents $i_{C1}$–$i_{C7}$.

In Embodiment 8, current source 22, resistor RB, P channel MOS transistor $Q_{P12}$ and control circuit 24 form reference current generation means. Ring oscillator 20B form oscillator means. Current source 20 and resistor RB form potential generation means. P channel MOS transistor $Q_{P12}$ forms voltage-current conversion means. Control circuit 24 and P channel MOS transistor $Q_{P13}$ form a reference transistor in the reference current generation means.

[Embodiment 9]

Figure 10:
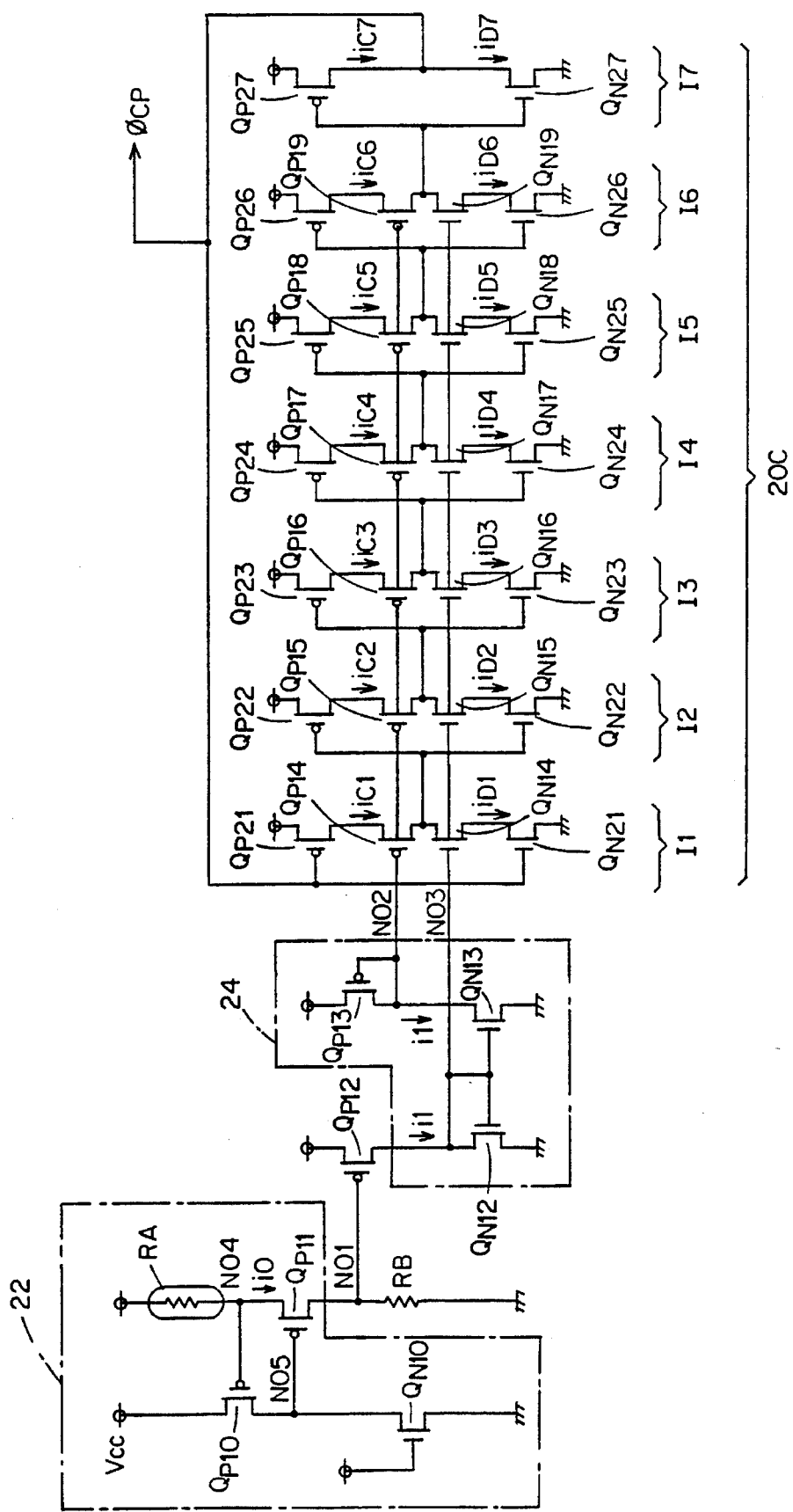

FIG. 10 is a circuit diagram showing a structure of an oscillator circuit of a DRAM according to a ninth embodiment of the present invention. The entire structure of the DRAM of Embodiment 9 is similar to that shown in FIG. 22.

Referring to FIG. 10, an oscillator circuit includes a ring oscillator 20, a current source 22, a resistor RB, a P channel MOS transistor $Q_{P12}$, and a control circuit 29. The oscillator circuit of Embodiment 9 differs from that of Embodiment 1 in ring oscillator 20C.

Ring oscillator 20C includes seven inverters I1–I7 connected in a ring manner. Each of inverters I1–I7 includes P channel MOS transistors $Q_{P21}$–$Q_{P27}$ and N channel MOS transistors $Q_{N21}$–$Q_{N27}$.

All the inverters excluding the last stage inverter I7, i.e. each of inverters I1–I6, further includes a P channel MOS transistor $Q_{P14}$ connected between the output node and the drain electrodes of P channel MOS transistors $Q_{P21}$–$Q_{P26}$, and N channel MOS transistors $Q_{N14}$–$Q_{N19}$ connected between the output node and the drain electrodes of P channel MOS transistors $Q_{N21}$–$Q_{N26}$.

Differing from Embodiment 1, inverter I7 of the last stage in ring oscillator 20C does not include a transistor for limiting charge/discharge currents $i_{C7}$ and $i_{D7}$.

Therefore, the current for driving a subsequent stage of frequency divider 16 flows from the power supply node to the output node via only P channel MOS transistor $Q_{P27}$ or from the output node to the ground node via only N channel MOS transistor $Q_{N27}$. This means that the output impedance of ring oscillator 20C is reduced. Therefore, frequency divider 16 of the subsequent stage can be driven sufficiently.

Although the charge/discharge rate in inverter I7 of the last stage is increased, the cycle of clock signal $\phi_{CP}$ generated by ring oscillator 20C does not differ greatly from that of Embodiment 1 since six inverters I1–I6 out of the seven inverters I1–I7 include transistors $Q_{P14}$–$Q_{P19}$ and $Q_{N14}$–$Q_{N19}$ limiting the charge/discharge currents. In Embodiment 9, ring oscillator 20C forms oscillator means.

[Embodiment 10]

Figure 11:
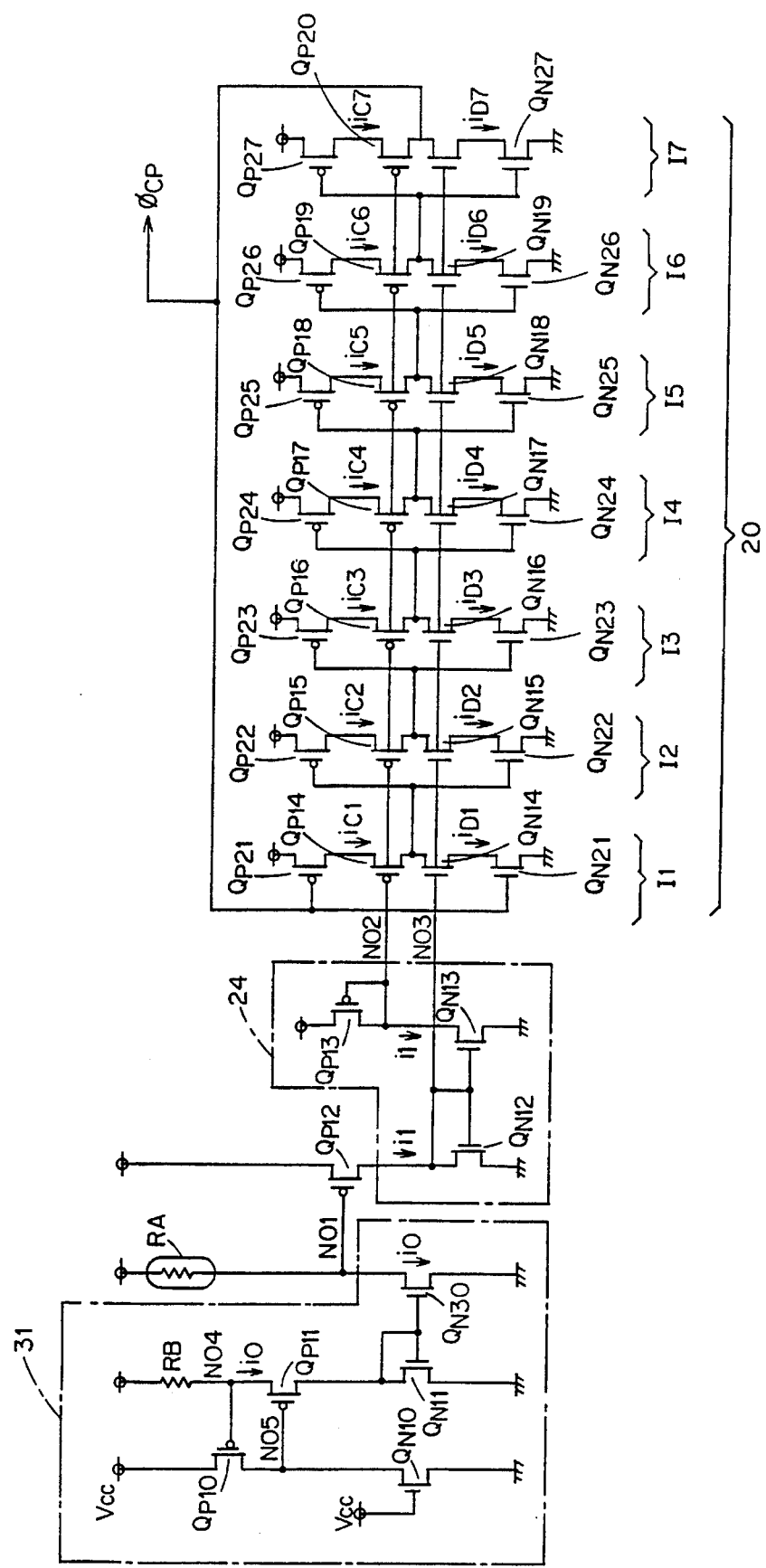

FIG. 11 is a circuit diagram showing a structure of an oscillator circuit of a DRAM according to a tenth embodiment of the present invention. The entire structure of the DRAM of Embodiment 10 is similar to that shown in FIG. 22.

Referring to FIG. 11, an oscillator circuit includes a ring oscillator 20, a constant current source 31, a resistor RA, a P channel MOS transistor $Q_{P12}$, and a control circuit 24. Ring oscillator 20, P channel MOS transistor $Q_{P12}$ and control circuit 24 are similar to those shown in Embodiment 1.

Similar to current source 22 of Embodiment 1, constant current source 31 includes P channel MOS transistors $Q_{P10}$ and $Q_{P11}$, and an N channel MOS transistor $Q_{N10}$. Constant current source 31 further includes a resistor RB connected between the power supply node and the gate electrode of P channel MOS transistor $Q_{P10}$, a diode-connected N channel MOS transistor $Q_{N11}$ connected between the drain electrode of P channel MOS transistor $Q_{P11}$ and the ground node, and an N channel MOS transistor $Q_{N30}$ connected between output node NO1 and the ground node, and having the gate electrode connected to the gate electrode of N channel MOS transistor $Q_{N11}$ Resistor RB is formed of, for example, an N+diffusion layer, and has an extremely low negative temperature coefficient, or a temperature coefficient near zero. Therefore, the value of resistor RB is slightly or hardly reduced as the operating temperature rises.

In contrast, the absolute value of threshold voltage $V_{THO}$ of P channel MOS transistor $Q_{P10}$ becomes smaller as the operating temperature rises.

Similar to Embodiment 1, the threshold voltage of P channel MOS transistor $Q_{P10}$ is applied to resistor RB. However, the value of current $i_0$ flowing to resistor RB is slightly or hardly reduced even if the operating temperature rises.

Current $i_0$ equal to the value of current $i_0$ flows to resistor RA by N channel MOS transistors $Q_{N11}$ and $Q_{N30}$ forming a current mirror circuit. Thus, constant current source 31 supplies a constant current $i_0$ to resistor RA. Since resistor RA has a positive temperature coefficient, the value increases as the operating temperature rises. A voltage of a power supply level $V_{cc}$ is applied to one node of resistor RA.

According to this oscillator circuit, the value of resistor RA increases as the operating temperature rises, whereby the voltage drop of resistor RA becomes greater since current $i_0$ flowing through resistor RA is substantially constant. As a result, a voltage of a lower level is applied to the gate electrode of P channel MOS transistor $Q_{P12}$ to reduce the resistance of P channel MOS transistor $Q_{P12}$. Therefore, reference current $i_1$ of a greater level flows to transistor $Q_{P12}$.

Similar to Embodiment 1, a current of a value equal to reference current $i_1$ flows to the P channel and N channel MOS transistors in each inverter. Therefore, the cycle of clock signal $\phi_{CP}$ generated by the ring oscillator becomes shorter as the operating temperature rises.

Furthermore, a voltage of a power supply level $V_{cc}$ is applied to one node of resistor RA and to the source of P channel MOS transistor $Q_{P12}$. Therefore, the voltage applied across the source and the gate of P channel MOS transistor $Q_{P12}$ will not change by just a drift in power supply level $V_{cc}$. As a result, reference current $i_1$ flowing through transistor $Q_{P12}$ does not also change.

Thus, the oscillation cycle of this oscillator circuit is independent of a change in power supply level $V_{cc}$ when the operating temperature is constant. Therefore, the oscillation frequency varies only in response to the operating temperature.

[Embodiment 11]

Figure 12:
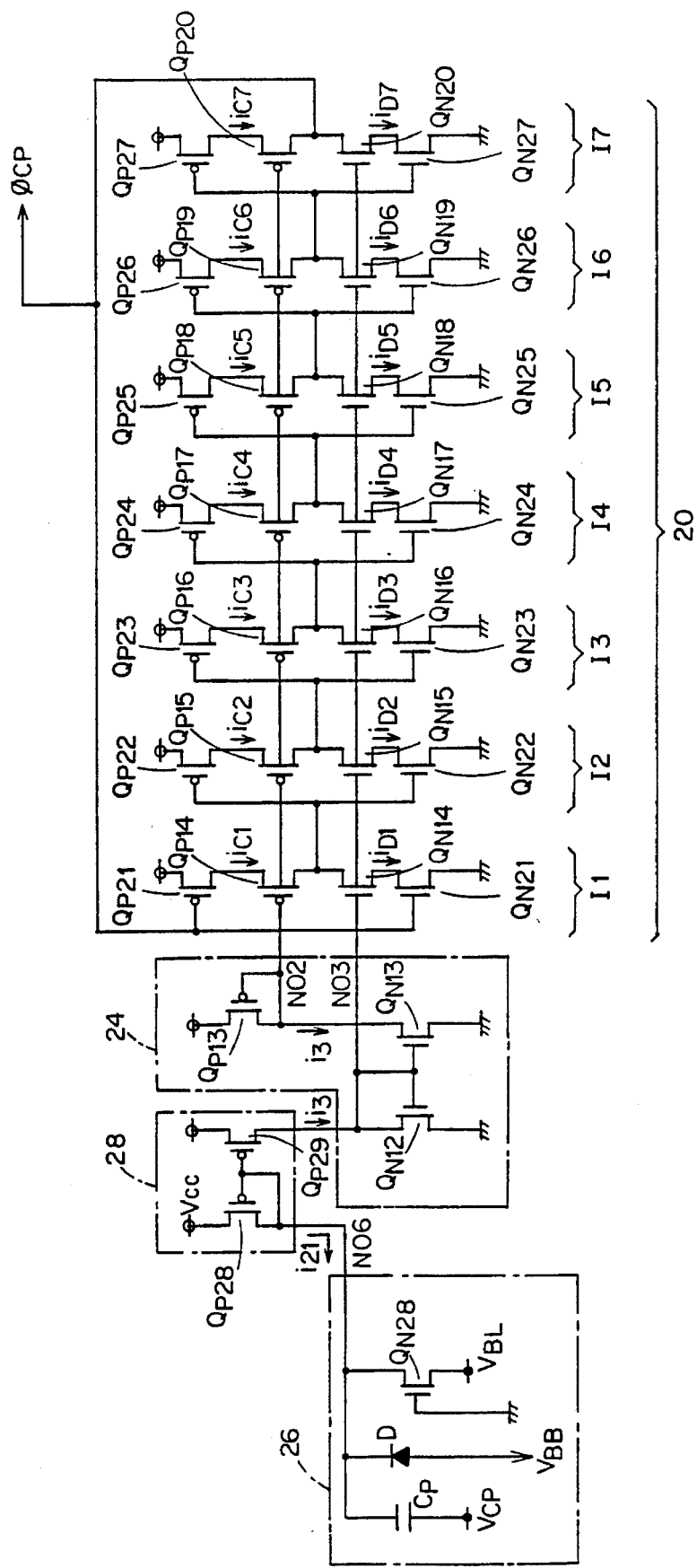

FIG. 12 is a circuit diagram showing a structure of an oscillator circuit of a DRAM according to an eleventh embodiment of the present invention. The entire structure of the DRAM of Embodiment 11 is similar to that of FIG. 22.

Referring to FIG. 12, an oscillator circuit includes a ring oscillator 20, a leak monitor 26, an amplify circuit 28, and a control circuit 24. Leak monitor 26 includes a capacitor $C_p$, a diode D, and an N channel MOS transistor $Q_{N28}$.

Capacitor $C_p$ has a structure similar to a capacitor of a memory cell forming memory cell array 1. Diode D has a PN junction including a P type semiconductor substrate in which memory cell array 1 and ring oscillator 20 are formed, and an N type diffusion layer formed on the semiconductor substrate. This PN junction has a structure similar to the PN junction of an N type source/drain region and a P type semiconductor substrate of a transfer gate of a memory cell. N channel MOS transistor $Q_{N28}$ has a structure similar to that of a transistor for precharging a bit line. Therefore, leak monitor 26 has characteristics similar to those of a memory cell.

One electrode of capacitor $C_p$, the cathode electrode of diode D, and the source electrode of transistor $Q_{N28}$ are connected to a node NO6. A self plate voltage $V_{CP}$, generally $1/2V_{cc}$, is applied to the other electrode of capacitor $C_p$.

A substrate voltage $V_{BB}$, generally a negative voltage, is applied to the anode electrode of diode D. A precharge voltage $V_{BL}$, generally $1/2V_{cc}$ for precharging a bit line is applied to the drain electrode of transistor $Q_{N28}$. A voltage of the ground level is applied to the gate electrode of transistor $Q_{N28}$ Amplify circuit 28 includes a current mirror circuit formed by P channel MOS transistors $Q_{P28}$ and $Q_{P29}$. Control circuit 24 and ring oscillator 20 are similar to those of Embodiment 1.

The operation of Embodiment 11 will be described hereinafter.

Similar to the aforementioned proper memory cell, reference current $i_2$ flowing to leak monitor 26 is increased as the operating temperature rises since leakage current or the like increases as the operating temperature rises. Because leak monitor 26 has a structure similar to a proper memory cell in memory cell array 1, reference current $i_2$ of a value equal to that of the leakage current in the proper memory cell flows.

Because the size of transistor $Q_{P29}$ forming amplify circuit 28 is set to, for example 10 times the size of transistor $Q_{P28}$, reference current $i_3$ which is 10 times the reference current $i_2$ flowing to leak monitor 26 is fed to control circuit 24. This causes reference current $i_3$ of a value equal to reference current $i_3$ supplied from amplified circuit 28 to flow through ring oscillator 20 by control circuit 24.

When the input node of inverter I1 of the first stage attains a L level, P and N channel MOS transistors $Q_{P21}$ and $Q_{N21}$ are rendered conductive and non-conductive, respectively. As a result, charge current $i_{C1}$ flows from the power supply node to the gate electrodes of P and N channel MOS transistors $Q_{P22}$ and $Q_{N22}$ of inverter I2 of the second stage via two P channel MOS transistors $Q_{P21}$ and $Q_{P14}$. This charge current $i_{C1}$ is equal to the above-described reference current $i_3$.

When the input node of inverter I1 of the first stage attains a H level, P and N channel MOS transistors $Q_{P21}$ and $Q_{N21}$ are rendered non-conductive and conductive, respectively. As a result, discharge current $i_{D1}$ flows from the gate electrodes of P and N channel MOS transistors $Q_{P22}$ and $Q_{N22}$ in inverter I2 of the second stage through the ground node via through N channel MOS transistors $Q_{N14}$ and $Q_{N22}$. This discharge current $i_{D1}$ is equal to the aforementioned reference current $i_3$.

When the operating temperature is constant, reference current $i_2$ flowing towards leak monitor 26 and current $i_3$ flowing through each of inverters I1–I7 forming ring oscillator 20 are also constant. Therefore, the cycle of a clock signal $\phi_{CP}$ generated by ring oscillator 20 is also constant. Thus, a refresh operation is executed at a constant cycle.

As the operating temperature rises, reference current $i_2$ flowing towards leak monitor 26 is increased. Accordingly, reference current $i_3$ supplied from amplify circuit 28 is also increased. As a result, currents $i_{C1}$–$i_{C7}$ and $i_{D1}$–$i_{D7}$ flowing in each of inverters Ii–I7 are also increased. Therefore, the cycle of clock signal $\phi_{CP}$ generated by ring oscillator 20 is also shortened.

Thus, the cycle of clock signal $\phi_{CP}$ becomes shorter as the operating temperature rises, whereby a refresh operation of an optimum cycle is always carried out. Thus, extra current consumption is reduced.

Because Embodiment 11 employs a leak monitor 26, the refresh cycle is directly determined according to the data retaining ability of memory cell array 1. Thus, a refresh operation can be executed at a further optimized cycle in comparison with that of Embodiment 1.

In Embodiment 11, leak monitor 26, amplify circuit 28, and control circuit 24 form reference current generation means. Ring oscillator 20 forms oscillator means. P channel MOS transistor $Q_{P13}$ and N channel MOS transistor $Q_{N12}$ in control circuit 24 form a reference transistor in respective reference current generation means.

[Embodiment 12]

Figure 13:
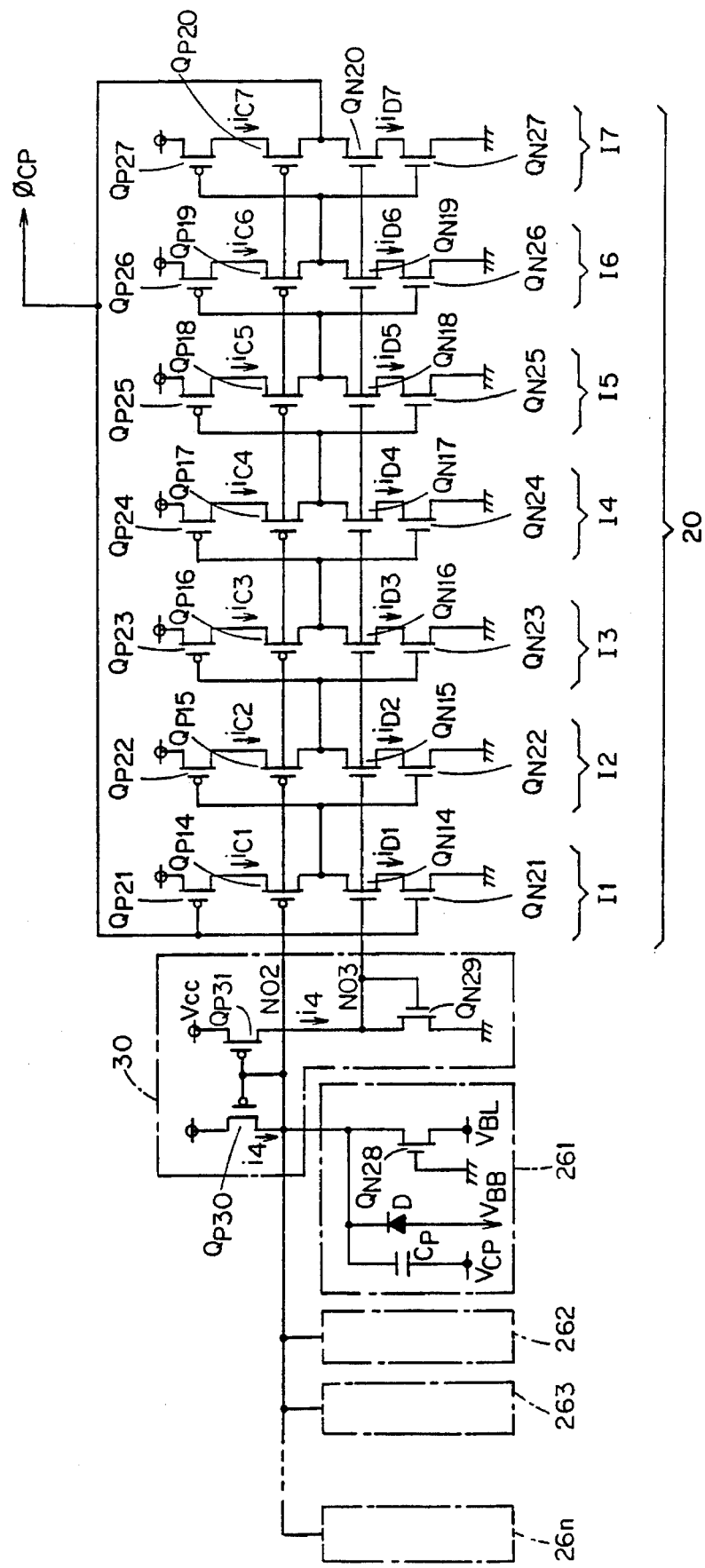

FIG. 13 is a circuit diagram showing a structure of an oscillator circuit of a DRAM according to a twelfth embodiment of the present invention. The entire structure of the DRAM of Embodiment 12 is similar to that shown in FIG. 22.

Referring to FIG. 13, an oscillator circuit includes a ring oscillator 20, a plurality of leak monitors 261–26n, and a control circuit 30. Each of leak monitors 261–26n is similar to leak monitor 26 of Embodiment 11. Ring oscillator 20 is also similar to that of Embodiment 11.

Control circuit 30 includes two P channel MOS transistors $Q_{P30}$ and $Q_{P31}$ forming a current mirror circuit, and an N channel MOS transistor $Q_{N29}$ forming a current mirror circuit with respective N channel MOS transistor $Q_{N14}$–$Q_{N20}$ in ring oscillator 20.

According to Embodiment 12, the total current $i_4$ of the currents flowing to each of leak monitors 261–26n flow within transistor $Q_{P30}$ as a reference current. Currents $i_{C1}$–$i_{C7}$ equal to reference current $i_4$ flowing in transistor $Q_{P30}$ flow in each of inverters I1–I7 by the current mirror circuits formed by transistors $Q_{P30}$ and $Q_{P14}$–$Q_{P20}$. Reference current $i_4$ equal in value to reference current $i_4$ flowing in transistor $Q_{P30}$ flows within transistor $Q_{N29}$ by a current mirror circuit formed by transistors $Q_{P30}$ and $Q_{P31}$. Furthermore, currents $i_{D1}$–$i_{D7}$ equal in value to reference current $i_4$ flowing within transistor $Q_{N29}$ flows in each of inverters I1–I7 by the current mirror circuits formed by transistors $Q_{N29}$ and $Q_{N14}$–$Q_{N20}$.

When total current $i_4$ of the currents flowing into each of leak monitors 261–26n is constant, currents $i_{C1}$–$i_{C7}$ and $i_{D1}$–$i_{D7}$ flowing in each of inverters I1–I7 are also constant. Therefore, the cycle of clock signal $\phi_{CP}$ generated by ring oscillator 20 is also constant.

As the operating temperature rises, total current $i_4$ of the currents flowing to each of leak monitors 261–26n increases. Therefore, currents $i_{C1}$–$i_{C7}$ and $i_{D1}$–$i_{D7}$ flowing in each of inverters I1–I7 also increase as the leakage current in a memory cell increases, whereby the cycle of clock signal $\phi_{CP}$ generated by ring oscillator 20 becomes shorter.

According to Embodiment 12, a refresh operation is executed always at an appropriate cycle in response to the amount of leakage current in a memory cell. Therefore, extra current consumption can be reduced. Because the oscillator circuit of Embodiment 12 employs leak monitors 261–26n, it is not necessarily required to provide an amplify circuit 28 as in Embodiment 11.

Since it is difficult to provide a leak monitor that generates a leakage current similar to that of a proper memory cell, the leakage current generated by each of leak monitors 261–26n exhibits variation. However, the variation of currents flowing into each of leak monitors 261–26n can be averaged by providing a plurality of leak monitors 261–26n and using the total current flowing thereto as a reference current as in Embodiment 12. Therefore, a refresh operation can be executed in a cycle more optimized than that of Embodiment 11. The oscillator circuit of Embodiment 12 is effective for practical usage.

An effect similar to that of the above-described embodiments can be obtained even when a plurality of leak monitors and an amplify circuit for amplifying the total current flowing thereto are provided.

In Embodiment 12, leak monitors 261-26n and control circuit 30 form reference current generation means. Ring oscillator 20 form oscillator means. P channel MOS transistor $Q_{P30}$ and N channel MOS transistor $Q_{N29}$ in control circuit 30 respectively form a reference transistor in the reference current generation means.

[Embodiment 13]

Figure 14:
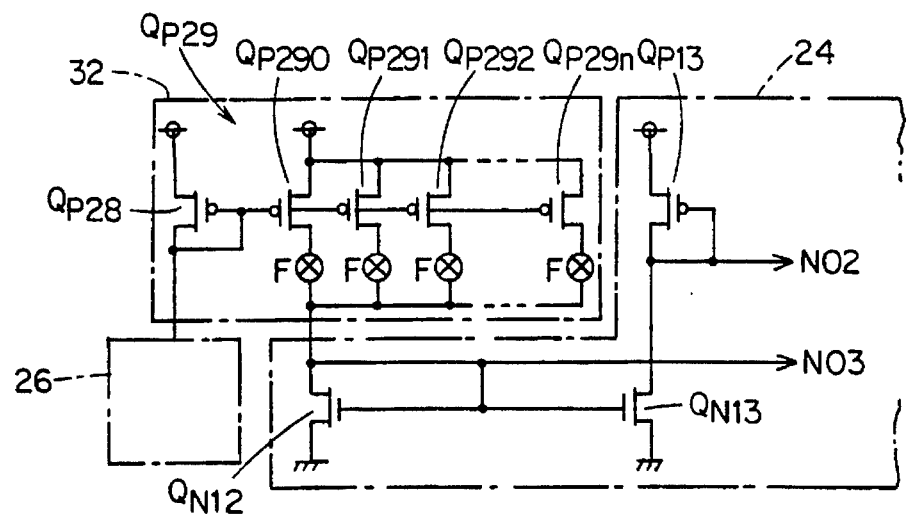
FIGS. 14 and 15 are circuit diagrams showing a partial structure of an oscillator circuit of a DRAM according to 13th and 14th embodiments of the present invention, respectively, particularly showing other examples of a P channel MOS transistor for amplification/shown in FIG. 12.

FIG. 14 shows a thirteenth embodiment of the present invention wherein amplify circuit 28 of Embodiment 11 shown in FIG. 12 is modified.

Referring to FIG. 14, an amplify circuit 32 includes a P channel MOS transistor $Q_{P28}$, a plurality of P channel MOS transistors $Q_{P290}$-$Q_{P29n}$, and a plurality of fuses F corresponding in number to those of the P channel MOS transistors. Fuses F are connected respectively in series with transistors $Q_{P290}$-$Q_{P29n}$. Transistors $Q_{P290}$-$Q_{P29n}$ and fuses F are connected parallel to each other.

According to Embodiment 13, the size of transistor $Q_{P29}$ can be selectively varied by appropriately blowing out any of fuses F. This means that the amplification rate of amplify circuit 32 can be selectively specified. Therefore, a refresh operation of a cycle more optimized than that of Embodiment 11 can be carried out in Embodiment 13. In Embodiment 13, fuse F forms a program element.

[Embodiment 14]

Figure 15:
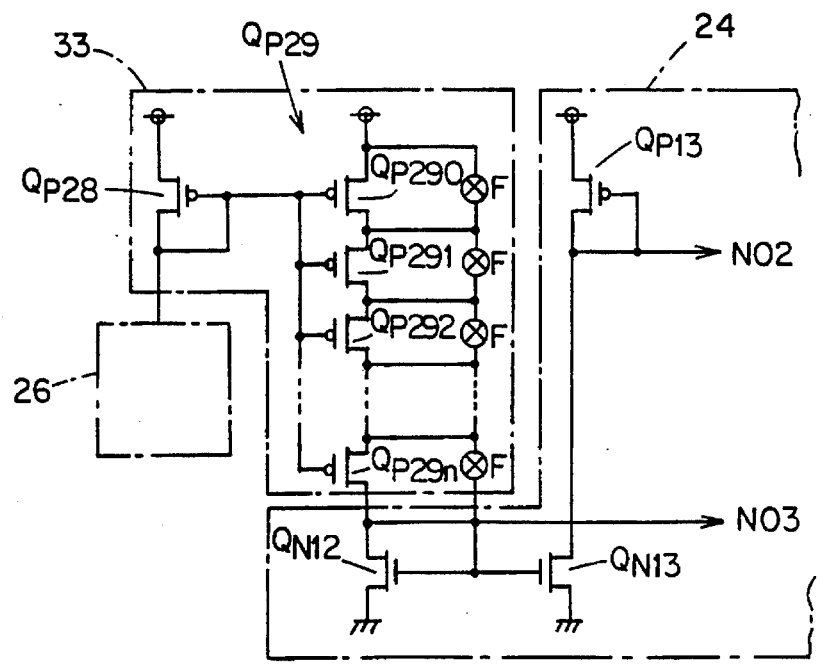

FIG. 15 shows a fourteenth embodiment of the present invention, wherein amplify circuit 28 of Embodiment 11 shown in FIG. 12 is modified.

Referring to FIG. 15, an amplify circuit 33 includes a P channel MOS transistor $Q_{P28}$, a plurality of P channel MOS transistors $Q_{P290}$-$Q_{P29n}$, and a plurality of fuses F identical in number to the P channel MOS transistors. Transistors $Q_{P290}$-$Q_{P29n}$ are all connected in series. Fuses F are connected parallel to respective transistors $Q_{P290}$-$Q_{P29n}$.

According to Embodiment 14, the size of transistor $Q_{P29}$ can be selectively varied by appropriately blowing out any of fuses F. This provides an advantage similar to that of Embodiment 13 such as the amplification rate of amplify circuit can be selectively specified. In Embodiment 14, fuse F forms a program element.

[Embodiment 15]

Figure 16:
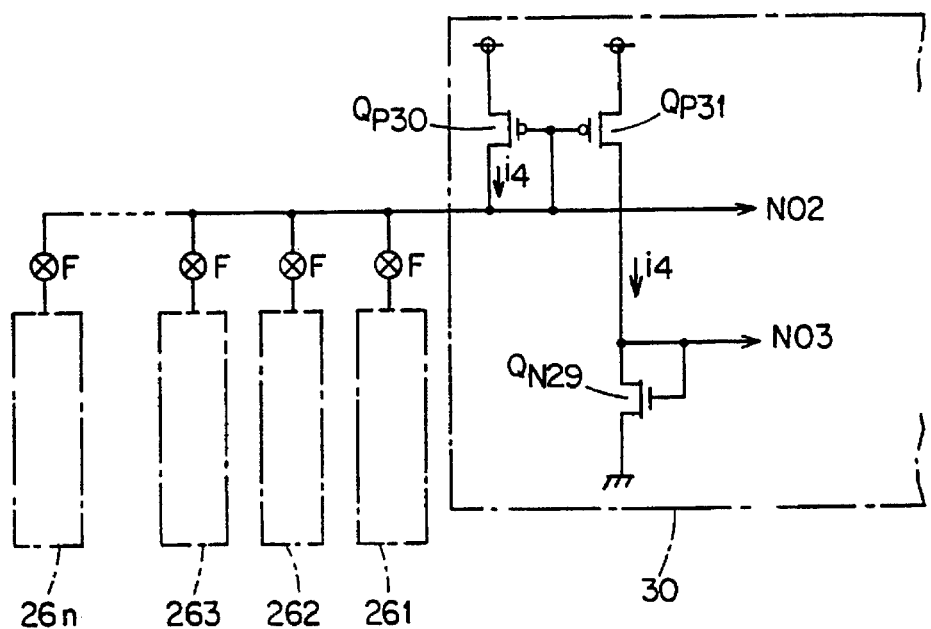
FIG. 16 is a circuit diagram showing a partial structure of an oscillator circuit of a DRAM according to a 15th embodiment of the present invention.

FIG. 16 shows a fifteenth embodiment of the present invention, wherein the leak monitor of Embodiment 12 shown in FIG. 13 is modified.

Referring to FIG. 16, Embodiment 15 includes a plurality of leak monitors 261-26n, and a plurality of fuses F identical in number to the leak monitors. Fuses F are connected in series respectively with leak monitors 261-26n.

According to Embodiment 15, the value of total current $i_4$ flowing to the leak monitors can be selectively varied by appropriately blowing out any of fuses F. Therefore, the oscillation cycle of ring oscillator 20 can be selectively altered. Thus, a refresh operation can be executed at a cycle more optimized than that of Embodiment 12.

[Embodiment 16]

Figure 17:
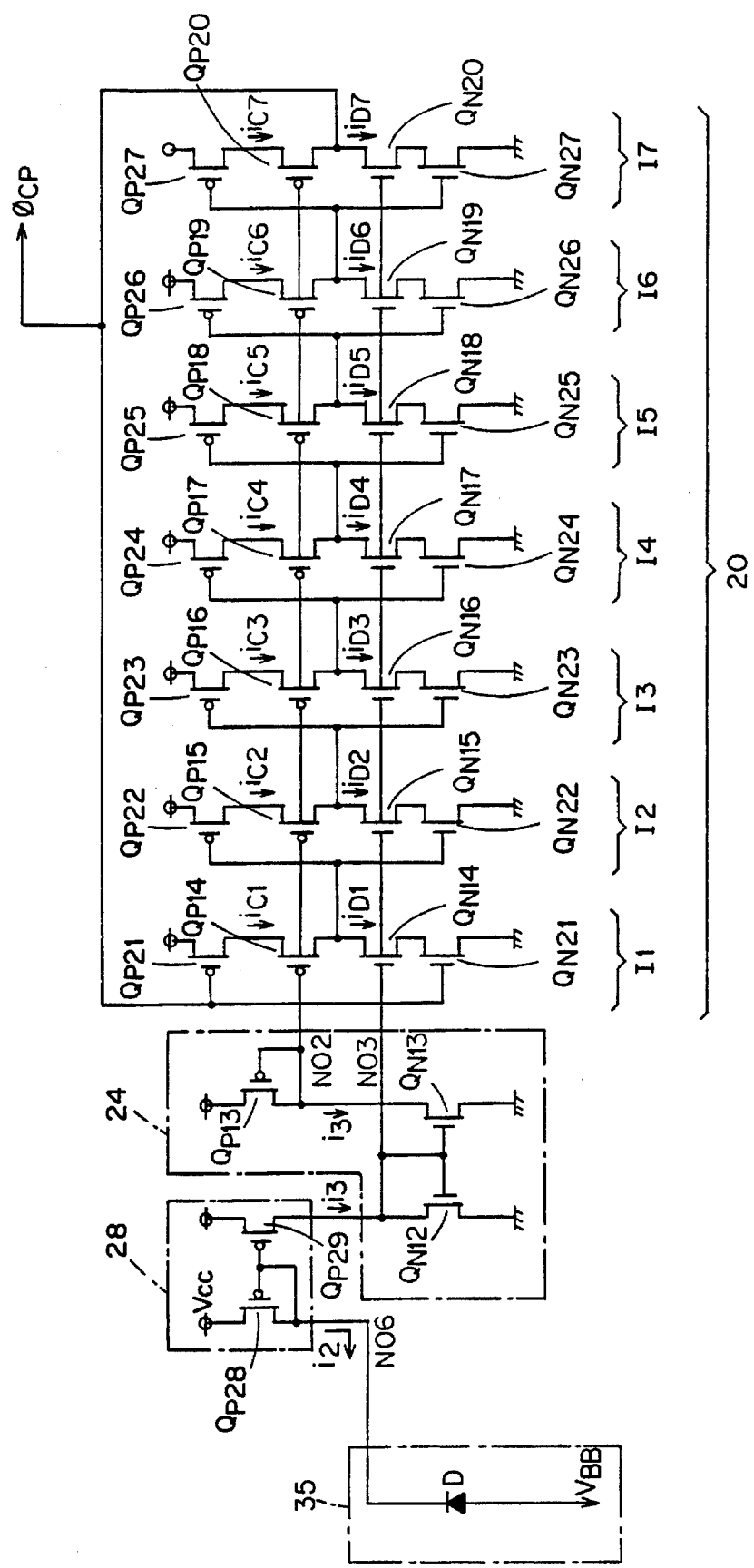
FIG. 17 is a diagram showing an entire structure of an oscillator circuit of a DRAM according to a 16th embodiment of the present invention.

FIG. 17 is a circuit diagram showing a structure of an oscillator circuit of a DRAM according to a sixteenth embodiment of the present invention. The entire structure of the DRAM of Embodiment 16 is similar to that shown in FIG. 22.

Referring to FIG. 17, an oscillator circuit includes a ring oscillator 20, a leak monitor 35, an amplify circuit 28, and a control circuit 24. The oscillator circuit of Embodiment 16 differs from that of Embodiment 11 in a leak monitor 35.

Leak monitor 35 includes a diode D formed of an PN junction. This PN junction has a structure similar to a PN junction formed of an N type source/drain region and a P type semiconductor substrate of a transfer gate of appropriate memory cell. A substrate voltage $V_{BB}$ is applied to the anode electrode of diode D.

In general, leakage current that flows in an opposite direction via a PN junction in a memory cell increases when operating temperature rises. Therefore, the leak monitor only requires a diode D having a structure similar to that of a PN junction in a proper memory cell. Capacitor $C_p$ and transistor $Q_{N28}$ of a proper memory cell are not required as in Embodiment 11.

Although substrate voltage $V_{BB}$ is applied to the anode electrode of diode D in Embodiment 16, ground voltage may alternatively be applied.

[Embodiment 17]

Although the output of ring oscillator 20 is directly applied to frequency divider 16 of a subsequent stage as clock signal $\phi_{CP}$ in the above-described embodiment, there is a problem that the waveform of a clock signal $\phi_{CP}$ is rounded when the cycle of clock signal $\phi_{CP}$ is lengthened.

Figure 18:
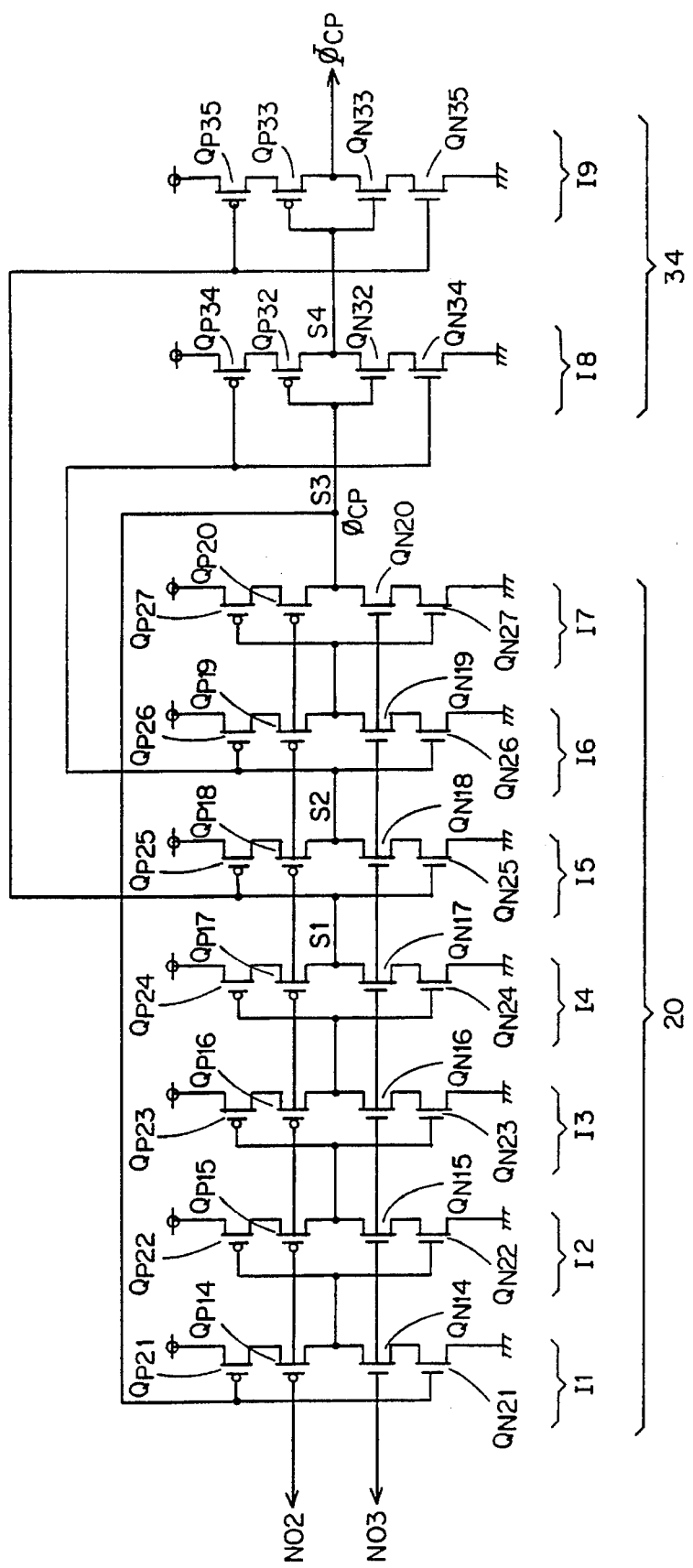
FIG. 18 is a circuit diagram showing a partial structure of an oscillator circuit of a DRAM according to a 17th embodiment of the present invention.

FIG. 18 is a circuit diagram showing a partial structure of an oscillator circuit according to Embodiment 17. Referring to FIG. 18, an oscillator circuit includes a ring oscillator 20 and a waveform shaping circuit 34.

Ring oscillator 20 includes seven inverters I1–I7 connected in a ring manner similar to the above embodiments. The gate electrodes of P channel MOS transistors $Q_{P14}$–$Q_{P20}$ in inverters I1–I7 are connected to the gate electrodes of P channel MOS transistor $Q_{P13}$ of control circuit 24 shown in Embodiment 1 of FIG. 1, for example. Furthermore, the gate electrodes of N channel MOS transistors $Q_{N10}$–$Q_{N20}$ are connected to the gate electrode of N channel MOS transistors $Q_{N12}$ of control circuit 24 shown in Embodiment 1 of FIG. 1.

Waveform shaping circuit 34 includes two clock inverters I8 and I9 connected in series. Clock inverters I8 and I9 respectively include P channel MOS transistors $Q_{P32}$, $Q_{P33}$ and N channel MOS transistors $Q_{N32}$, $Q_{N33}$, as well as P channel MOS transistors $Q_{P34}$, $Q_{P35}$ and N channel MOS transistors $Q_{N34}$, $Q_{N35}$. Both the gate electrodes of transistors $Q_{P32}$ and $Q_{N32}$ receive an output signal S3 of inverter I7. Both the gate electrodes of transistors $Q_{P33}$ and $Q_{N33}$ receive an output signal S4 of clock inverter I8. In contrast, the gate electrodes of transistors $Q_{P34}$ and $Q_{N34}$ receive an output signal S2 of inverter I5. Both the gate electrodes of transistors $Q_{P35}$ and $Q_{N35}$ receive an output signal S1 of inverter I4.

27

Figure 19:
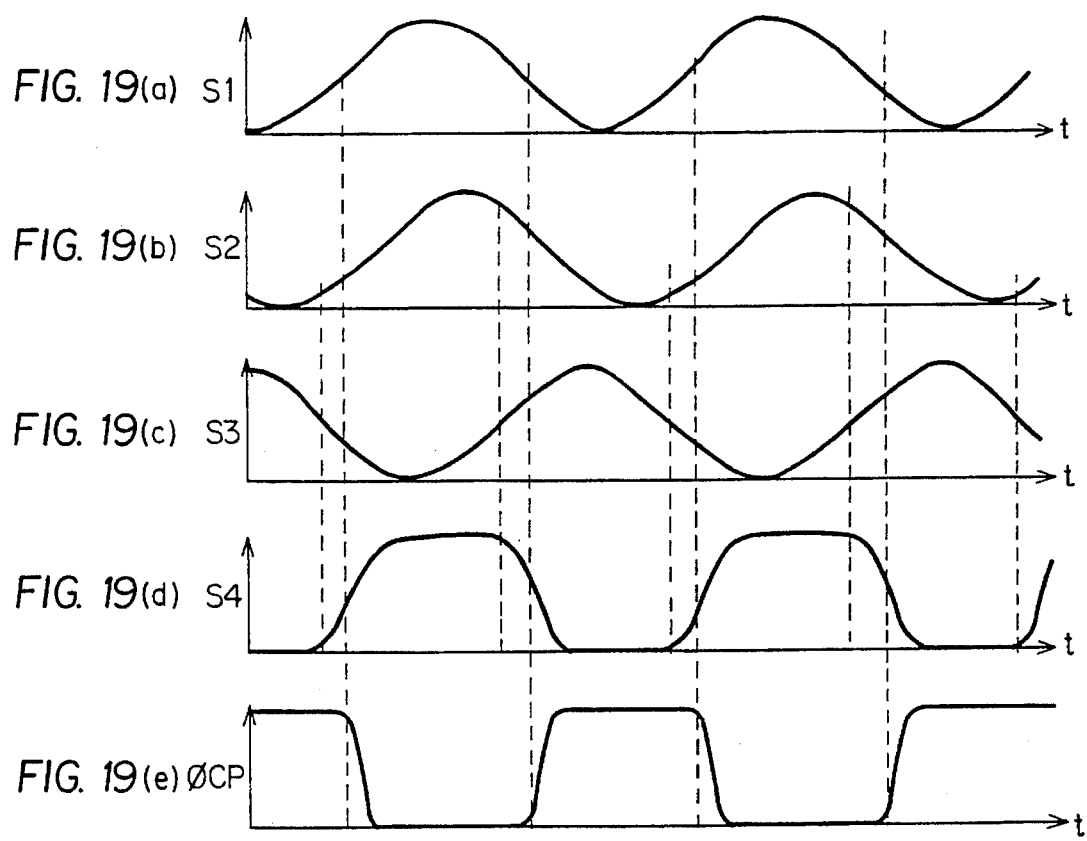
FIGS. 19(a)–19(e) is a timing chart showing an operation of the oscillator circuit of FIG. 18.

FIG. 19 is a timing chart showing an operation of ring oscillator 34.

Referring to FIG. 19, when output signals S2 and S3 of inverters I5 and I7 both attain a L level, output signal S4 of clock inverter I8 attains a H level. In contrast, when output signals S2 and S3 of inverters I5 and I7 both attain a H level, output signal S4 of clock inverter I8 attains a L level.

When output signals S1 and S4 of inverters I4 and I8 both attain a L level, output signal $\phi_{CP}$ of clock inverter I9 attains a H level. When output signals S1 and S4 of inverters I4 and I8 both attain a H level, output signal $\phi_{CP}$ of clock inverter I9 attains a L level.

According to this oscillator circuit, a clock signal $\phi_{CP}$ having its waveform shaped can be generated. Shaping the waveform of a clock signal is particularly effective in a ring oscillator having an extremely long oscillation cycle.

[Embodiment 18]

Figure 20:
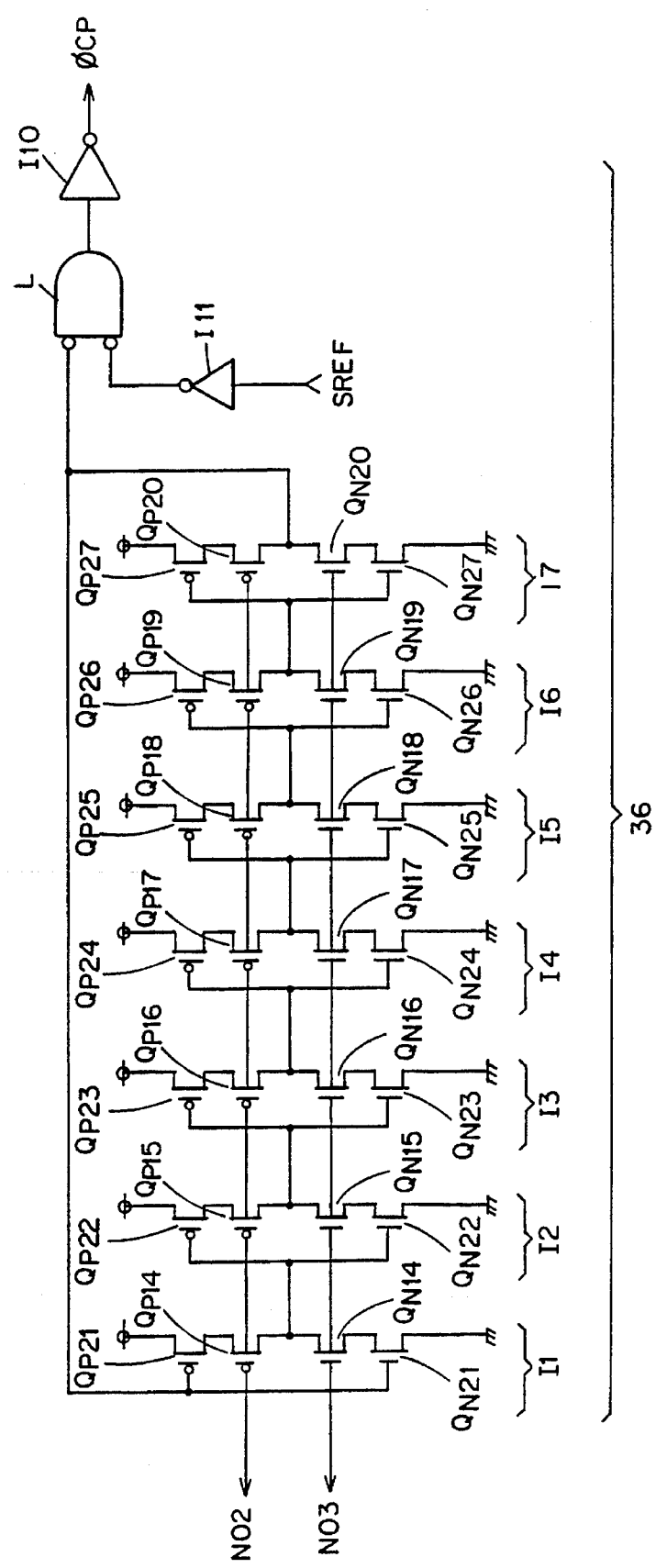
FIGS. 20 and 21 are circuit diagrams showing a partial structure of an oscillator circuit of a DRAM according to 18th and 19th embodiments of the present invention, respectively.

FIG. 20 is a circuit diagram showing a ring oscillator according to an eighteenth embodiment of the present invention. Referring to FIG. 20, a ring oscillator 36 includes 7 stages of inverters I1–I7 connected in a ring manner, a logic gate L, and inverters I10 and I11. Logic gate L has one terminal supplied with an output signal of inverter I7, and the other terminal supplied with a self refresh signal SREF via inverter I11. The output signal of logic gate L is output as clock signal $\phi_{CP}$ via inverter I10.

According to ring oscillator 36, the preceding stage of ring oscillator 36 is always oscillating. When a refresh operation is not executed, self refresh signal SREF is pulled to a L level, and clock signal $\phi_{CP}$ is always maintained at a H level. When a refresh operation is executed, self refresh signal SREF is pulled to a H level, and the output signal of inverter I7 is directly output at clock signal $\phi_{CP}$. Ring oscillator 36 can be used instead of the aforementioned ring oscillator.

[Embodiment 19]

Figure 21:
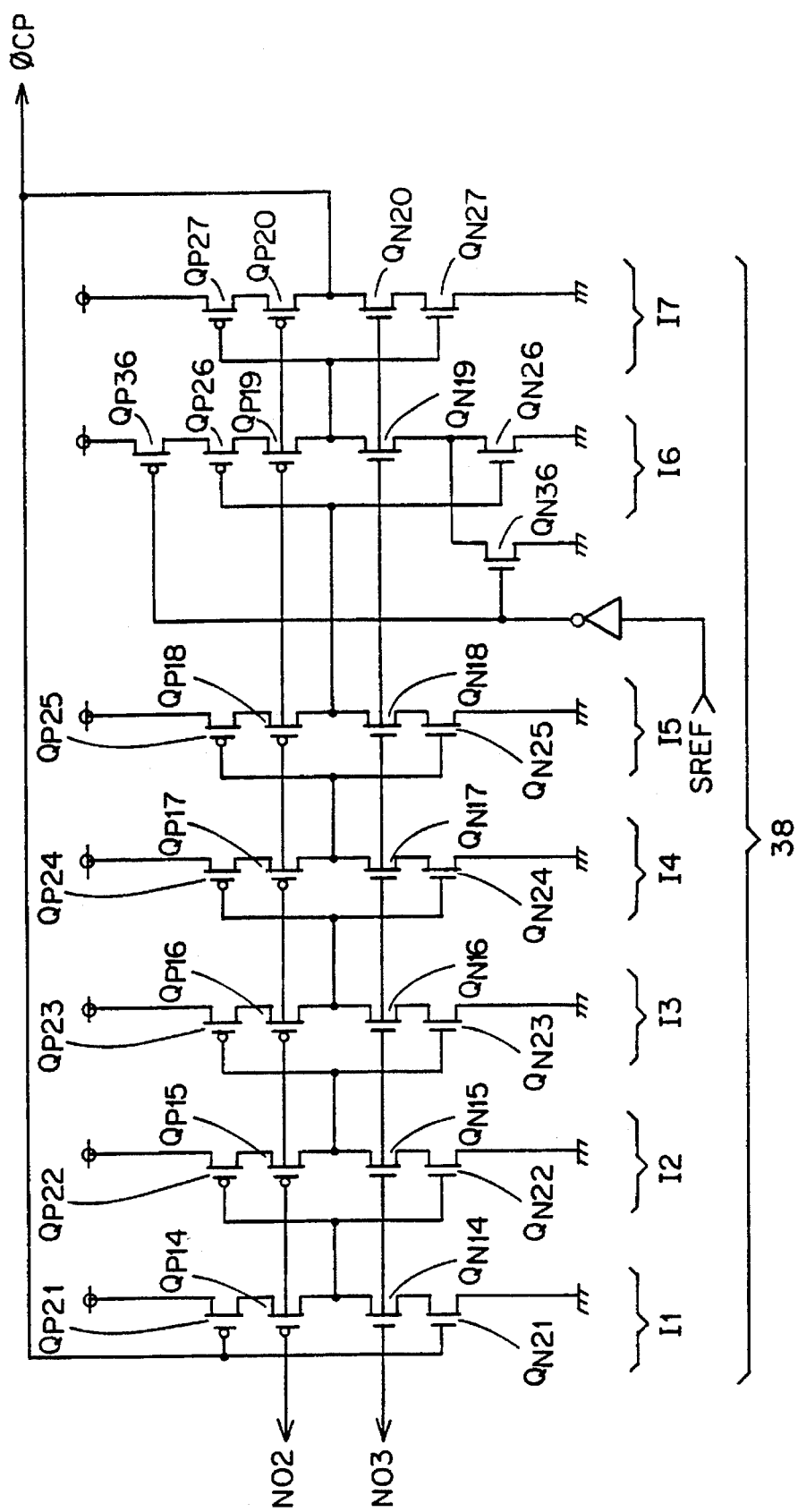

FIG. 21 is a circuit diagram showing a ring oscillator according to a nineteenth embodiment of the present invention.

Referring to FIG. 21, a ring oscillator 38 includes seven stages of inverters I1 and I7 connected in a ring manner, another inverter I12, a P channel MOS transistor $Q_{P36}$, and an N channel MOS transistor $Q_{N36}$. Transistor $Q_{P36}$ is connected between transistor $Q_{P26}$ forming inverter I6 and the power supply node. Transistor $Q_{N36}$ is connected parallel to transistor $Q_{N26}$ forming inverter I6. The gate electrodes of transistors $Q_{P36}$ and $Q_{N36}$ are supplied with self refresh signal SREF via inverter I12.

When a refresh operation is carried out in ring oscillator 38, self refresh signal SREF is pulled to a H level, whereby transistors $Q_{P36}$ and $Q_{N36}$ are rendered conductive and non-conductive, respectively. As a result, inverter I6 is activated, whereby ring oscillator 38 oscillates to generate a clock signal 100 $_{CP}$.

When a refresh operation is not carried out, self refresh signal SREF is pulled to a L level, whereby transistors $Q_{P36}$ and $Q_{N36}$ are rendered non-conductive and conductive, respectively. As a result, inverter I6 is deactivated, whereby oscillation of ring oscillator is suppressed and a clock signal $\phi_{CP}$ is not generated.

28

Ring oscillator 38 oscillates only when a refresh cycle is counted. Ring oscillator 38 may be used instead of the aforementioned ring oscillator.

[Other Embodiments]

In Embodiments 2–6 and 12–15, the cycle of a refresh operation is adjusted in optimum according to the characteristics of a manufactured DRAM by blowing out a fuse. Alternatively, adjustment may be carried out by modifying the mask for interconnection pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells requiring a refresh operation,
   an oscillator circuit including
      reference current generation means for generating a reference current varying in response to an operating temperature, and
      oscillator means for generating a clock signal having its cycle varying in response to said reference current, and
   refresh means responsive to said clock signal for carrying out a refresh operation for said plurality of memory cells.

2. A semiconductor memory device comprising:
   (a) a memory cell array including a plurality of memory cells requiring a refresh operation,
   (b) an oscillator circuit including
      reference current generation means including
      potential generation means for generating an output potential varying in response to an operating temperature, and
      voltage-current conversion means for generating a reference current varying in response to said output potential, and
      oscillator means including an odd number of a plurality of inverter means connected in a ring manner, and means responsive to said reference current for supplying a charge current and/or a discharge current from an output node of at least one of said plurality of inverter means to an input node of the inverter means having an input node connected to said output node, said oscillator means providing a clock signal from an output node of the inverter means of the last stage, and
   (c) refresh means responsive to said clock signal for carrying a refresh operation for said plurality of memory cells.

3. A semiconductor memory device comprising:
   a memory cell array including a plurality of memory cells requiring a refresh operation,
   an oscillator circuit including
      reference current generation means having a reference transistor in which a reference current varying in response to an operating temperature flows, and
      oscillator means including an odd number of a plurality of inverter means connected in ring manner, wherein each of said plurality of inverter means comprises an input node, an output node, a first transistor connected between a first power supply potential node and said output node and having a control electrode connected to said input node, and a second transistor connected between said output node and a second power supply potential node, and having a control electrode connected to said input node, wherein at least one of said plurality of inverter means further includes a control transistor forming a current mirror circuit with said reference transistor, and connected between said output node and said second power supply potential node, in series with said second transistor, said oscillator means providing a clock signal from the output node of an inverter means of the last stage, and refresh means responsive to said clock signal for carrying out a refresh operation for said plurality of memory cells.

4. A semiconductor memory device comprising:

a memory cell array including a plurality of memory cells requiring a refresh operation, an oscillator circuit including reference current generation means having a reference transistor in which a reference current varying in response to an operating temperature flows, and oscillator means including an odd number of a plurality of inverter means connected in a ring manner, wherein each of said plurality of inverter means comprises an input node, an output node, a first transistor connected between a first power supply potential node and said output node, and having a control electrode connected to said input node, and a second transistor connected between said output node and a second power supply potential node, and having a control electrode connected to said input node, wherein at least one of said plurality of inverter means further includes a control transistor forming a current mirror circuit with said reference transistor, connected between said first power supply potential node and said output node, in series with said first transistor, said oscillator means providing a clock signal from the output node of an inverter means of the last stage, and refresh means responsive to said clock signal for carrying out a refresh operation for said plurality of memory cells.

5. A semiconductor memory device comprising:

a memory cell array including a plurality of memory cells requiring a refresh operation, an oscillator circuit including reference current generation means, wherein said reference current generation means includes a reference P channel transistor in which a reference current flows varying in response to an operating temperature, and a reference N channel transistor in which a reference current flows varying in response to an operating temperature, and oscillator means including an odd number of a plurality of inverter means connected in a ring manner, each of said plurality of inverter means including an input node, an output node, a P channel transistor, connected between a first power supply potential node and said output node, and having a control electrode connected to said input node, and an N channel transistor, connected between said output node and a second power supply potential node, having a control electrode connected to said input node, wherein at least one of said plurality of inverter means further includes a control P channel transistor forming a current mirror circuit with said reference P channel transistor, connected between said first power supply potential node and said output node, in series with said P channel transistor, and a control N channel transistor forming a current mirror circuit with said reference N channel transistor, connected between said output node and said second power supply potential node, in series with said N channel transistor, said oscillator means providing a clock signal from an output node of the inverter means of the last stage, refresh means responsive to said clock signal for carrying out a refresh operation for said plurality of memory cells.

6. A semiconductor memory device, comprising:

a memory cell array including a plurality of memory cells requiring a refresh operation;

an oscillator circuit including reference current generation means, wherein said reference current generation means includes a reference P channel transistor in which a reference current flows varying in response to an operating temperature, and a reference N channel transistor in which a reference current flows varying in response to an operating temperature, and oscillator means including an odd number of a plurality of inverter means connected in a ring manner, each of said plurality of inverter means including an input node, an output node, a P channel transistor, connected between a first power supply potential node and said output node, and having a control electrode connected to said input node, and an N channel transistor, connected between said output node and a second power supply potential node, having a control electrode connected to said input node, wherein at least one of said plurality of inverter means further includes a control P channel transistor forming a current mirror circuit with said reference P channel transistor, connected between said first power supply potential node and said output node, in series with said P channel transistor, and a control N channel transistor forming a current mirror circuit with said reference N channel transistor, connected between said output node and said second power supply potential node, in series with said N channel transistor, said oscillator means providing a clock signal from an output node of the inverter means of the last stage, and a refresh means responsive to said clock signal for carrying out a refresh operation for said plurality of memory cells;

wherein said reference current generation means comprises potential generation means for generating an output potential varying in response to an operating temperature, and voltage-current conversion means for generating a current varying in response to said output potential, and wherein said reference current flows in said reference P and N channel transistors in response to said current generated by said voltage-current conversion means.

7. The semiconductor memory device according to claim 6, wherein said potential generation means comprises resistor means having a positive temperature coefficient, connected between a node for providing said output potential and said first power supply potential node.

8. The semiconductor memory device according to claim 7, wherein said resistor means comprises a plurality of resistance elements having a positive temperature coefficient, and a plurality of program elements provided corresponding to said plurality of resistance elements for activating and deactivating a corresponding resistance element.

9. The semiconductor memory device according to claim 5, wherein each of said plurality of memory cells comprises one transistor element, and one capacitor element, wherein said reference current generation means comprises a reference capacitor element having a first and a second electrode, and having said first electrode connected to one electrode of said capacitor element of a memory cell, and a supply transistor connected between said second electrode of said reference capacitor element and said first power supply potential node for supplying a current to said second electrode of said reference capacitor element, wherein said reference current flows in said reference P and N channel transistors in response to a current flowing in said supply transistor.

10. The semiconductor memory device according to claim 5, wherein each of said plurality of memory cells comprises one transistor element, and one capacitor element, wherein said reference current generation means comprises a diode element having a PN junction of a configuration and size similar to those of said transistor element, and a supply transistor connected between an electrode of said diode element and said first power supply potential node for supplying a current to said electrode of said diode element, wherein said reference current flows in said reference P and N channel transistors in response to a current flowing in said supply transistor.

11. The semiconductor memory device according to claim 2, further comprising:

waveform shaping means for receiving said clock signal from said oscillator means and shaping the waveform thereof.

12. The semiconductor memory device according to claim 11, wherein said waveform shaping means comprises first waveform shaping inverter means including a first input node for receiving said clock signal from said oscillator means, a first output node, two first P channel transistors connected in series between a first power supply potential node and said first output node, and two first N channel transistors connected between said first output node and a second power supply potential node, wherein a gate electrode of one of said two first P channel transistors is connected to said first input node, and a gate electrode of the other of said two first P channel transistors is connected to an output node of one inverter means in a stage other than the last stage in said oscillator means, and a gate electrode of one of said two first N channel transistors is connected to said first input node, and a gate electrode of the other of said two first N channel transistors is connected to an output node of said one inverter means, a second waveform shaping inverter means including a second input node connected to said first output node of said first waveform shaping inverter means, a second output node for providing a clock signal having its waveform shaped, two second P channel transistors connected in series between said first power supply potential node and said second output node, and two second N channel transistors connected between said second output node and said second power supply potential node, wherein a gate electrode of one of said two second P channel transistors is connected to said second input node, and a gate electrode of the other of said two second P channel transistors is connected to an input node of said one inverter means, and a gate electrode of one of said two second N channel transistors is connected to said second input node, and a gate electrode of the other of said two second N channel transistors is connected to an input node of said one inverter means.

13. The semiconductor memory device according to claim 2, wherein said oscillator means receives a self refresh signal for providing said clock signal when said self refresh signal indicates execution of a self refresh operation, and for suppressing output of said clock signal when said self refresh signal does not indicate execution of the self refresh operation.

* * * * *